United States Patent
Noda et al.

(10) Patent No.: US 10,032,626 B2
(45) Date of Patent: Jul. 24, 2018

(54) METHOD OF MANUFACTURING SEMICONDUCTOR DEVICE BY FORMING A FILM ON A SUBSTRATE, SUBSTRATE PROCESSING APPARATUS, AND RECORDING MEDIUM

(71) Applicant: HITACHI KOKUSAI ELECTRIC INC., Tokyo (JP)

(72) Inventors: Takaaki Noda, Toyama (JP); Shingo Nohara, Toyama (JP); Kosuke Takagi, Toyama (JP); Takeo Hanashima, Toyama (JP); Mamoru Sueyoshi, Toyama (JP); Kotaro Konno, Toyama (JP); Motoshi Sawada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/511,831

(22) PCT Filed: Sep. 19, 2014

(86) PCT No.: PCT/JP2014/074869
§ 371 (c)(1),
(2) Date: Mar. 16, 2017

(87) PCT Pub. No.: WO2016/042663
PCT Pub. Date: Mar. 24, 2016

(65) Prior Publication Data
US 2017/0287696 A1  Oct. 5, 2017

(51) Int. Cl.
H01L 21/00 (2006.01)
H01L 21/02 (2006.01)
(Continued)

(52) U.S. Cl.
CPC ........ *H01L 21/0228* (2013.01); *C23C 16/401* (2013.01); *C23C 16/4408* (2013.01);
(Continued)

(58) Field of Classification Search
CPC ............ C23C 16/452; C23C 16/45544; C23C 16/45512; C23C 16/4408; C23C 16/455
See application file for complete search history.

(56) References Cited

U.S. PATENT DOCUMENTS

2011/0124204 A1* 5/2011 Ota .................. C23C 16/402
438/787
2011/0256733 A1* 10/2011 Hirose .................. C23C 16/30
438/770

(Continued)

FOREIGN PATENT DOCUMENTS

JP     09-251960 A    9/1997
JP   2001-291670 A   10/2001
(Continued)

OTHER PUBLICATIONS

International Search Report, PCT/JP2014/074869, dated Dec. 16, 2014, 2 pgs.

*Primary Examiner* — Ngan Ngo
(74) *Attorney, Agent, or Firm* — Volpe and Koenig, P.C.

(57) ABSTRACT

A semiconductor device manufacturing method includes: vertically arranging and storing a plurality of substrates in a processing container and forming a condition where at least an upper region or a lower region relative to a substrate disposing region where the plurality of substrates are arranged is blocked off by an adaptor; and while maintaining the condition, forming films on the plurality of substrates by performing a cycle including the following steps a predetermined number of times in a non-simultaneous manner: supplying source gas to the plurality of substrates in the processing container from the side of the substrate disposing (Continued)

region; discharging the source gas from the interior of the processing container via exhaust piping; supplying reaction gas to the plurality of substrates in the processing container from the side of the substrate disposing region; and discharging the reaction gas from the interior of the processing container via the exhaust piping.

15 Claims, 21 Drawing Sheets

(51) Int. Cl.
    *C23C 16/40* (2006.01)
    *C23C 16/458* (2006.01)
    *C23C 16/452* (2006.01)
    *C23C 16/455* (2006.01)
    *C23C 16/44* (2006.01)

(52) U.S. Cl.
    CPC .......... *C23C 16/452* (2013.01); *C23C 16/455* (2013.01); *C23C 16/4587* (2013.01); *C23C 16/45512* (2013.01); *C23C 16/45544* (2013.01); *H01L 21/02126* (2013.01); *H01L 21/02164* (2013.01)

(56) References Cited

U.S. PATENT DOCUMENTS

| | | | |
|---|---|---|---|
| 2012/0272892 A1* | 11/2012 | Paranjpe | ................. C30B 25/10 117/86 |
| 2015/0270125 A1* | 9/2015 | Sasaki | ............... H01L 21/02186 438/785 |
| 2017/0103885 A1* | 4/2017 | Nakamura | .......... H01L 21/0228 |
| 2017/0243764 A1* | 8/2017 | Ueda | ................. H01L 21/67017 |

FOREIGN PATENT DOCUMENTS

| | | |
|---|---|---|
| JP | 2004-221227 A | 8/2004 |
| JP | 2009-182286 A | 8/2009 |
| JP | 2011-018707 A | 1/2011 |
| JP | 2011-129879 A | 6/2011 |
| JP | 2011-199134 A | 10/2011 |
| JP | 2014-013928 A | 1/2014 |
| JP | 2014-056961 A | 3/2014 |
| WO | 2014/080785 A1 | 5/2014 |

\* cited by examiner

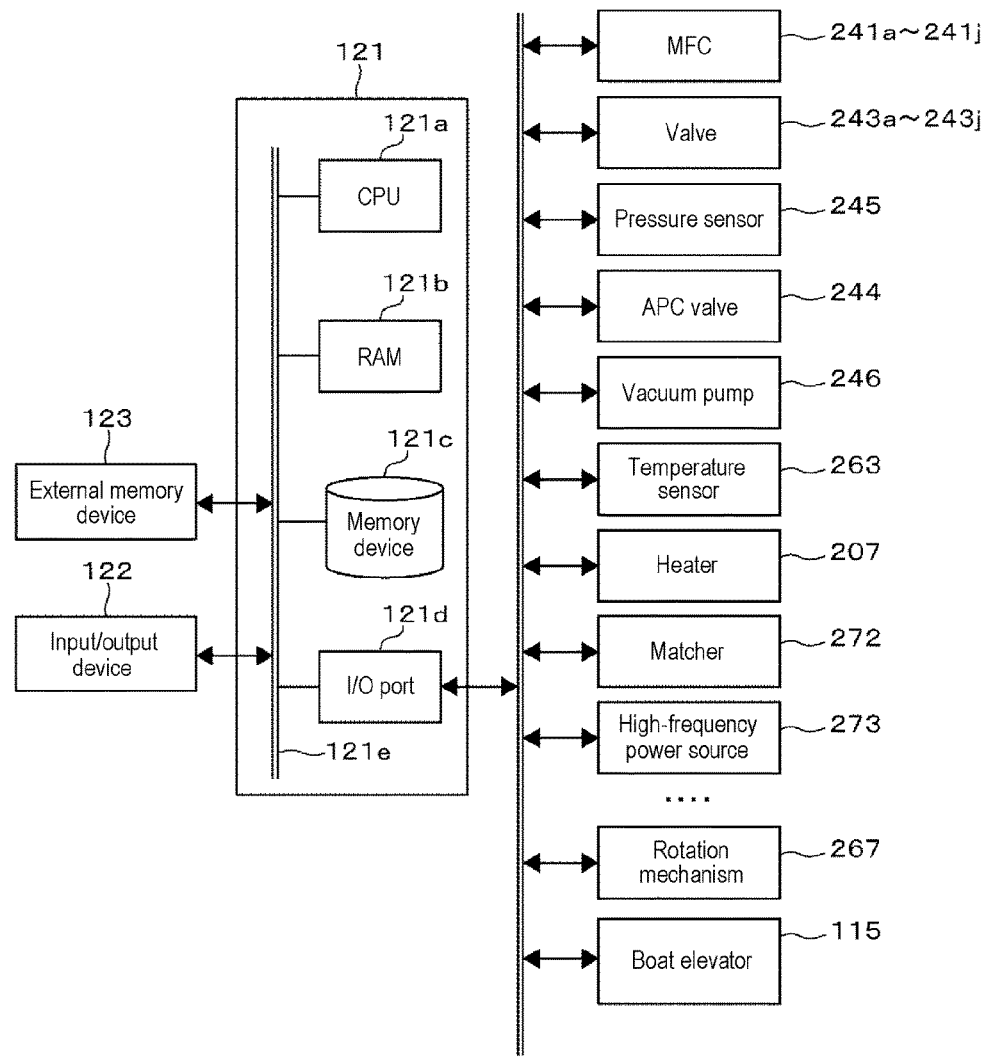
FIG. 3
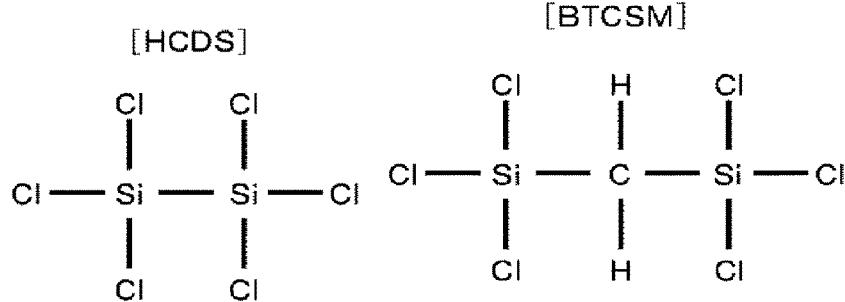
FIG. 4A [HCDS]
FIG. 4B [BTCSM]

[BTCSE]

[TCDMDS]

[DCTMDS]

[MCPMDS]

FIG. 5

| Name | Pyridine | Amino pyridine | Picoline | Lutidine |
|---|---|---|---|---|
| Composition formula | $C_5H_5N$ | $C_5H_6N_2$ | $C_6H_7N$ | $C_7H_9N$ |
| Structural formula | (pyridine ring) | (2-aminopyridine) | (2-picoline) | (2,6-lutidine) |
| Acid dissociation constant (pka) | 5.67 | 6.89 | 6.07 | 6.96 |

| Name | Pyrimidine | Quinoline | Piperazine | Piperidine |
|---|---|---|---|---|
| Composition formula | $C_4H_4N_2$ | $C_9H_7N$ | $C_4H_{10}N_2$ | $C_5H_{11}N$ |
| Structural formula | (pyrimidine) | (quinoline) | (piperazine) | (piperidine) |
| Acid dissociation constant (pka) | 1.30 | 4.97 | 9.80 | 11.12 |

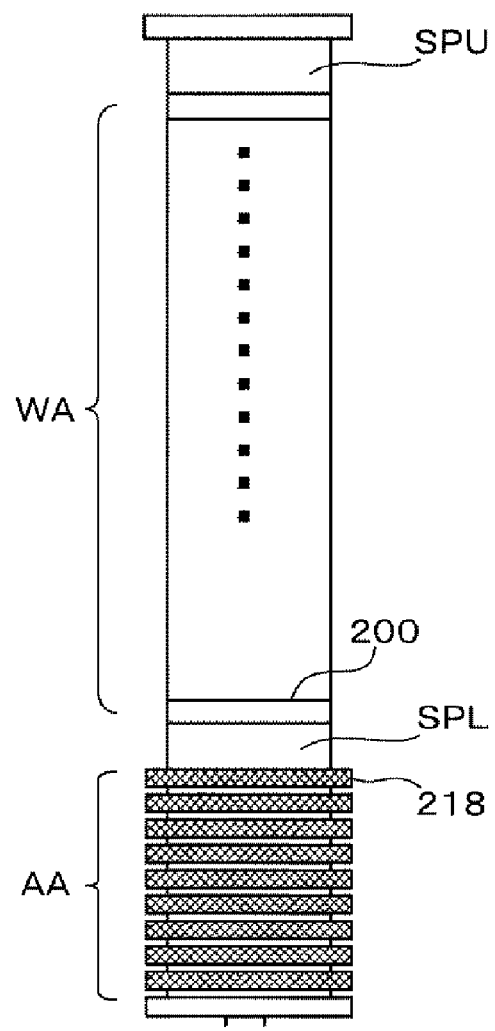

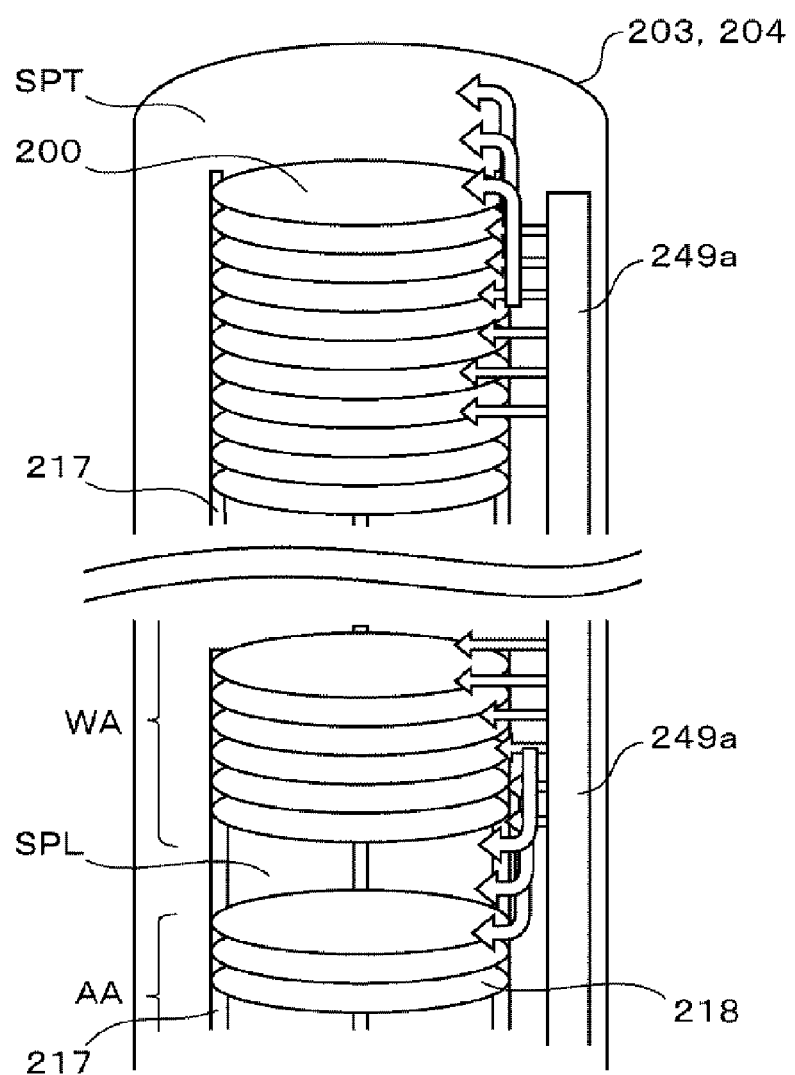

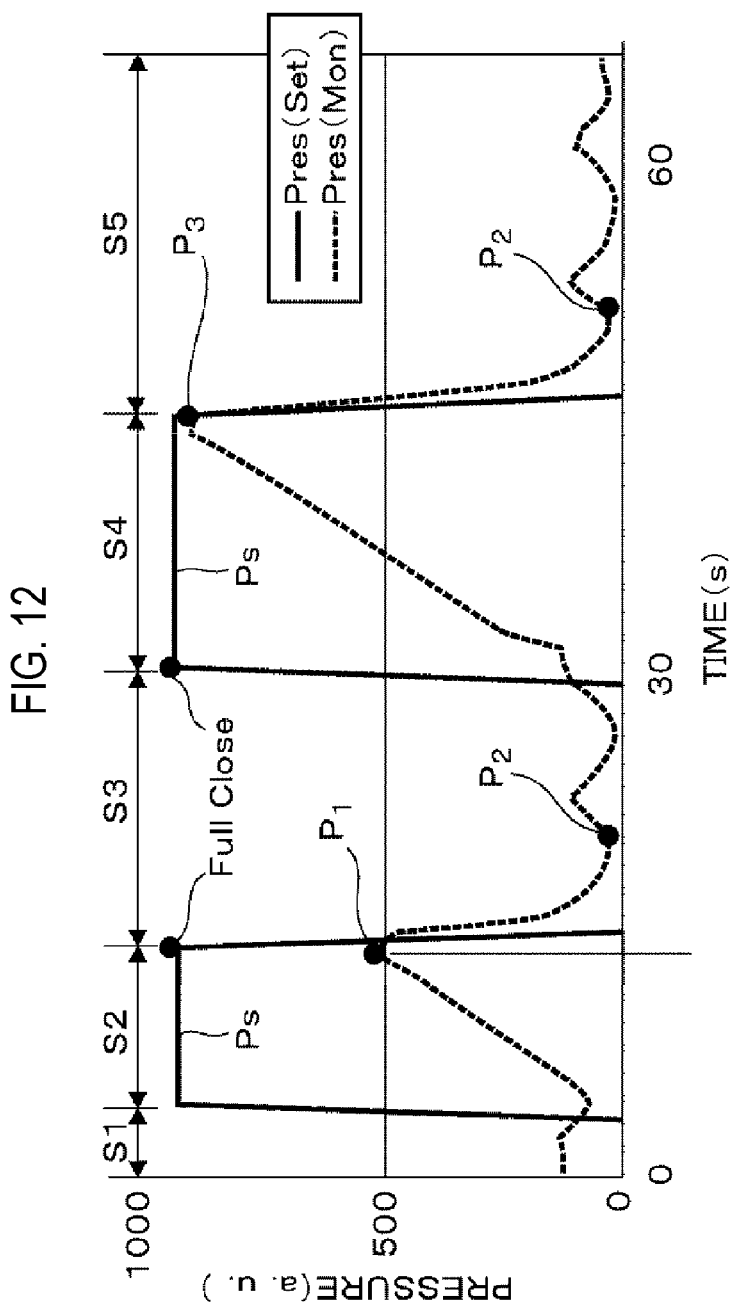

METHOD OF MANUFACTURING SEMICONDUCTOR DEVICE BY FORMING A FILM ON A SUBSTRATE, SUBSTRATE PROCESSING APPARATUS, AND RECORDING MEDIUM

TECHNICAL FIELD

The present disclosure relates to a method of manufacturing a semiconductor device, which can be applied to, for example, a technique of controlling a deposition amount of an ultra-thin film in a semiconductor film forming process.

BACKGROUND

As one of processes of manufacturing a semiconductor device, a process of forming a thin film such as a silicon oxide film or the like on a substrate is often carried out by supplying, for example, a precursor gas containing silicon, an oxidizing gas and the like to the substrate. In this case, the film can be formed at a relatively low temperature, for example by using a catalyst gas, thereby improving thermal history of semiconductor devices.

SUMMARY

However, when the aforementioned thin film is formed on the substrate, the outer peripheral portion of the substrate may have a thick film thickness distribution, relative to the central portion of the substrate.

The present disclosure provides some embodiments of a technique of enhancing uniformity of a film thickness.

According to one embodiment of the present disclosure, there is provided a method of manufacturing a semiconductor device, including: (a) arranging and accommodating a plurality of substrates in a vertical direction in a process vessel and blocking, by an adaptor, at least one of an upper space and a lower space of a substrate arrangement region in which the plurality of substrates is arranged; and (b) forming a film on each of the plurality of substrates by performing a cycle a predetermined number of times whiling blocking the at least one of the upper space and the lower space of the substrate arrangement region, the cycle including non-simultaneously performing: (b1) supplying a precursor gas to the plurality of substrates from a side of the substrate arrangement region in the process vessel; (b2) exhausting the precursor gas from the process vessel through an exhaust pipe; (b3) supplying a reaction gas to the plurality of substrates from the side of the substrate arrangement region in the process vessel; and (b4) exhausting the reaction gas from the process vessel through the exhaust pipe.

According to the present disclosure, it is possible to enhance uniformity of a film thickness.

BRIEF DESCRIPTION OF THE DRAWINGS

FIG. 3 is a schematic configuration diagram of a controller of the substrate processing apparatus suitably used in the embodiment of the present disclosure, in which a control system of the controller is shown in a block diagram.

FIG. 4A is a diagram illustrating a chemical structural formula of HCDS used as a precursor gas.

FIG. 4B is a diagram illustrating a chemical structural formula of BTCSM used as a precursor gas.

FIG. 5 is a diagram illustrating names, chemical composition formulas, chemical structural formulas, and acid dissociation constants of various amines used catalyst gases.

FIG. 6 is a longitudinal sectional view illustrating a schematic configuration of a substrate support of the embodiment of the present disclosure.

FIG. 10B is a cross sectional view schematically illustrating a flow of a gas within the process vessel of the substrate processing apparatus according to the embodiment.

FIG. 12 is a diagram illustrating a pressure change in a film forming sequence of the substrate processing apparatus according to example 1.

DETAILED DESCRIPTION

Figure 1:
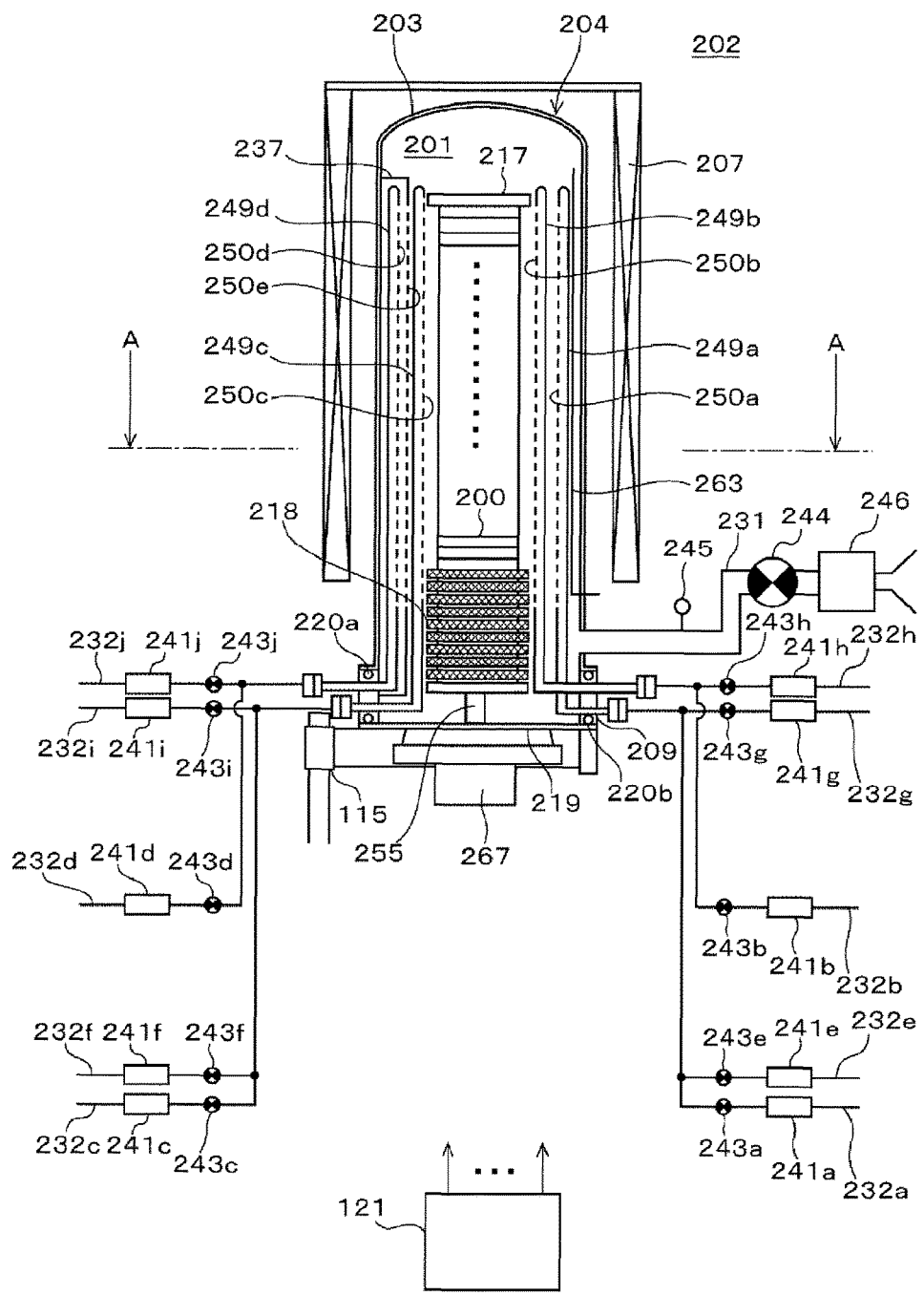
FIG. 1 is a schematic configuration diagram of a vertical type processing furnace of a substrate processing apparatus suitably used in an embodiment of the present disclosure, in which a portion of the processing furnace is shown in a vertical cross sectional view.

Embodiments, examples and modifications of the present disclosure will now be described with reference to the drawings. In the following description, however, the same components are denoted by the same reference numerals and a repetitive description thereof may be omitted. Further, in order to clarify the explanation, the drawings may be schematically represented in terms of the width, thickness, shape and the like of each part, relative to the actual forms, but it is merely an example and not intended to limit the interpretation of the present disclosure.

<Embodiment>

An embodiment of the present disclosure will be described with reference to FIGS. 1 to 8.

(1) General Configuration of Substrate Processing Apparatus

A substrate processing apparatus includes a processing furnace 202 and a controller 121 for controlling the processing furnace 202.

(Heating Mechanism)

As illustrated in FIG. 1, the processing furnace 202 has a heater 207 as a heating means (heating mechanism). The heater 207 has a cylindrical shape and is supported by a heater base (not shown) as a support plate so as to be vertically installed. The heater 207 functions as an activation mechanism (excitation part) configured to thermally activate (excite) a gas.

(Processing Vessel)

A reaction tube 203 is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal such as, e.g., stainless steel or the like and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base. Thus, the reaction tube 203 comes into a vertically mounted state. A process vessel (reaction vessel) is mainly configured by the reaction tube 203 and the manifold 209. A process chamber 201 is formed in a hollow cylindrical portion of the reaction tube 203. The process chamber 201 is configured to accommodate a plurality of wafers 200 as substrates. The wafers 200 are horizontally stacked in multiple stages along a vertical direction in a boat 217 which will be described hereinbelow.

(Gas Supply System)

Nozzles 249a to 249d are installed in the process chamber 201 so as to penetrate through a sidewall of the manifold 209. Gas supply pipes 232a to 232d are respectively connected to the nozzles 249a to 249d. A gas supply pipe 232e is connected to the gas supply pipe 232a. A gas supply pipe 232f is connected to the gas supply pipe 232c. In this way, four nozzles 249a to 249d and the plurality of gas supply pipes 232a to 232f are installed in the reaction tube 203 and are capable of supplying plural types of gases into the process chamber 201.

Mass flow controllers (MFCs) 241a to 241j, which are flow rate controllers (flow rate control parts), and valves 243a to 243j, which are opening/closing valves, are respectively installed in the gas supply pipes 232a to 232j sequentially from the corresponding upstream sides to which respective gas supply sources are connected. Downstream end portions of the gas supply pipes 232g to 232j are respectively connected to the gas supply pipes 232a to 232d at the downstream sides of the valves 243a to 243d. Downstream end portions of the gas supply pipes 232e and 232f are respectively connected to the gas supply pipes 232a and 232c at the downstream sides of the valves 243a and 243c.

Figure 2:
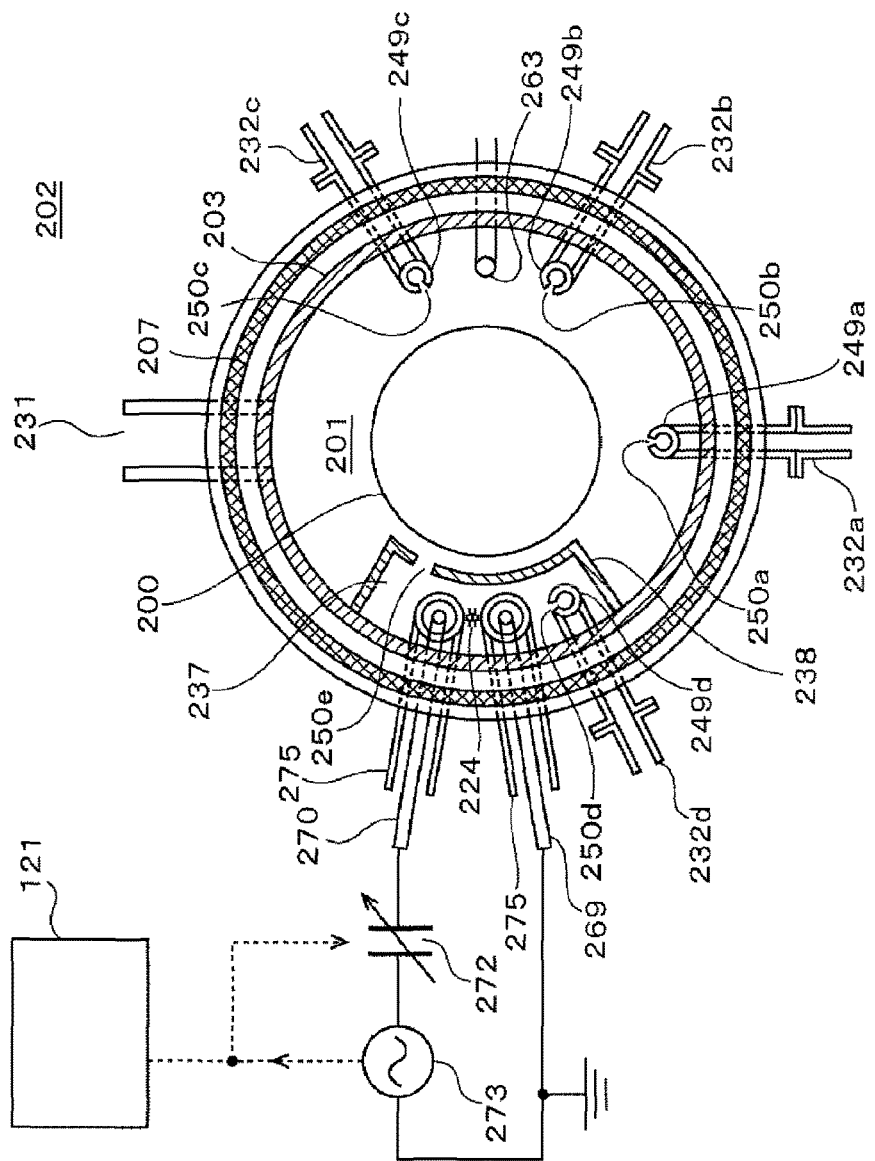
FIG. 2 is a schematic configuration diagram of the vertical type processing furnace of the substrate processing apparatus suitably used in the embodiment of the present disclosure, in which a portion of the processing furnace is shown in a cross sectional view taken along line A-A in FIG. 1A.

The nozzles 249a to 249c are respectively connected to front end portions of the gas supply pipes 232a to 232c. As illustrated in FIG. 2, the nozzles 249a to 249c are respectively disposed in a space with an annular shape between the inner wall of the reaction tube 203 and the wafers 200 such that the nozzles 249a to 249c extend upward along a stacking direction of the wafers 200 from a lower portion of the inner wall of the reaction tube 203 to an upper portion of the inner wall of the reaction tube 203. Specifically, the nozzles 249a to 249c are respectively installed at a lateral side of a wafer arrangement region (also referred to as a substrate arrangement region) in which the wafers 200 are arranged, namely in a region which horizontally surrounds the wafer arrangement region, so as to extend along the wafer arrangement region. That is, the nozzles 249a to 249c are respectively configured as L-shaped long nozzles. A horizontal portion of each of the nozzles 249a to 249c is installed to penetrate a sidewall of the manifold 209. A vertical portion of each of the nozzles 249a to 249c is installed to extend upward at least from one end portion of the wafer arrangement region toward the other end portion of the wafer arrangement region. Gas supply holes 250a to 250c for supplying a gas are respectively formed on the side surfaces of the nozzles 249a to 249c. As illustrated in FIG. 2, the gas supply holes 250a to 250c are opened toward the center of the reaction tube 203 so as to allow a gas to be supplied toward the wafers 200. The gas supply holes 250a to 250c may be formed in a plural number between the lower portion of the reaction tube 203 and the upper portion of the reaction tube 203. The respective gas supply holes 250a to 250c may have the same aperture area and may be formed at the same aperture pitch.

The nozzle 249d is connected to a front end portion of the gas supply pipe 232d. The nozzle 249d is installed within a buffer chamber 237 which is a gas diffusion space. As illustrated in FIG. 2, the buffer chamber 237 is installed in a space with an annular shape between the inner wall of the reaction tube 203 and the wafers 200 such that the buffer chamber 237 (the partition wall 237a) extends along the stacking direction of the wafers 200 from the lower portion of the inner wall of the reaction tube 203 to the upper portion of the inner wall of the reaction tube 203. That is, the buffer chamber 237 (the partition wall 237a) is installed at the lateral side of the wafer arrangement region, namely in the region which horizontally surrounds the wafer arrangement region, so as to extend along the wafer arrangement region. Gas supply holes 250e for supplying a gas are formed in an end portion of the wall 238 which adjoins the wafers 200 of the buffer chamber 237. The gas supply holes 250e are opened toward the center of the reaction tube 203 so as to allow a gas to be supplied toward the wafers 200. The gas supply holes 250e may be formed in a plural number between the lower portion of the reaction tube 203 and the upper portion of the reaction tube 203. The respective gas supply holes 250e may have the same aperture area and may be formed at the same aperture pitch.

As illustrated in FIG. 2, the nozzle 249d is installed in an end portion of the buffer chamber 237 opposite to the end portion of the buffer chamber 237 having the gas supply holes 250e such that the nozzle 249b extends upward along the stacking direction of the wafers 200 from the lower portion of the inner wall of the reaction tube 203 to the upper portion of the reaction tube 203. Specifically, the nozzle 249d is installed at the lateral side of the wafer arrangement region in which the wafers 200 are arranged, namely in the region which horizontally surrounds the wafer arrangement region, so as to extend along the wafer arrangement region. The nozzle 249d is configured as an L-shaped long nozzle. A horizontal portion of the nozzle 249d is installed to penetrate through the sidewall of the manifold 209. A vertical portion of the nozzle 249d is installed to extend upward at least from one end portion of the wafer arrangement region toward the other end portion of the wafer arrangement region. Gas supply holes 250d for supplying a gas are formed on the side surface of the nozzle 249d. As illustrated in FIG. 2, the gas supply holes 250d are opened toward the center of the buffer chamber 237. Similar to the gas supply holes 250e of the buffer chamber 237, the gas supply holes 250d may be formed in a plural number between the lower portion of the reaction tube 203 and the upper portion of the reaction tube 203. In the case where the differential pressure between the interior of the buffer chamber 237 and the interior of the process chamber 201 is small, the aperture area and the aperture pitch of the gas supply holes 250d may be respectively set to remain constant between the upstream side (lower portion) and the downstream side (upper portion) of the nozzle 249d. In the case where the differential pressure between the interior of the buffer chamber 237 and the interior of the process chamber 201 is large, the aperture area of the gas supply holes 250d may be set to become gradually larger from the upstream side toward the downstream side of the nozzle 249d, or the aperture pitch of the gas supply holes 250d may be set to become gradually smaller from the upstream side toward the downstream side of the nozzle 249d.

In the present embodiment, by adjusting the aperture area or the aperture pitch of the gas supply holes 250d between the upstream side and the downstream side as mentioned above, it is possible to inject a gas from the respective gas supply holes 250d at different flow velocities but at a substantially equal flow rate. The gas injected from the respective gas supply holes 250d is first introduced into the buffer chamber 237. This makes it possible to equalize the flow velocities of the gas within the buffer chamber 237. That is, the gas injected from the respective gas supply holes 250d into the buffer chamber 237 is injected from the gas supply holes 250e into the process chamber 201 after the particle velocity of the gas is relaxed within the buffer chamber 237. Thus, the gas injected from the respective gas supply holes 250d into the buffer chamber 237 has a uniform flow rate and a uniform flow velocity when injected from the respective gas supply holes 250e into the process chamber 201.

As described above, in the method of supplying a gas using long nozzles according to the present embodiment, a gas is transferred through the nozzles 249a to 249d and the buffer chamber 237, which are disposed in a vertically-elongated space with an annular shape, i.e., a cylindrical space, defined by the inner wall of the reaction tube 203 and the end portions of the wafers 200 arranged within the reaction tube 203. The gas is initially injected into the reaction tube 203, near the wafers 200, through the gas supply holes 250a to 250e formed in the nozzles 249a to 249d and the buffer chamber 237. Accordingly, the gas into the reaction tube 203 mainly flows in the reaction tube 203 in a direction parallel to surfaces of the wafers 200, i.e., in a horizontal direction. With this configuration, the gas can be uniformly supplied to the respective wafers 200. This makes it possible to improve the uniformity in the thickness of a film formed on the surface of each of the wafers 200. In addition, the gas flowing on the surfaces of the wafers 200 after the reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

(Precursor Gas, Reaction Gas, Catalyst Gas and Inert Gas)

As a precursor gas, which contains silicon (Si) as a first precursor gas and a halogen element, i.e., as a halogen-based precursor gas not containing C in gas molecules, for example, a chlorosilane-based precursor gas containing Si and a chloro group as a halogen group and not containing C in gas molecules, is supplied from the gas supply pipe 232e into the process chamber 201 via the MFC 241e, the valve 243e, the gas supply pipe 232a and the nozzle 249a. As described above, the chlorosilane-based precursor gas not containing C in gas molecules is a precursor gas serving as an Si source but not serving as a C source. As the chlorosilane-based precursor gas not containing C in gas molecules, which is supplied from the gas supply pipe 232e, for example, it may be possible to use a hexachlorodisilane ($Si_2Cl_6$, abbreviation: HCDS) gas as illustrated in FIG. 4A.

As a precursor gas, which contains Si, C and N as a second precursor gas and which has an Si—N bond, for example, an aminosilane-based precursor gas as a precursor gas containing Si and an amino group (amine group), is supplied from the gas supply pipe 232f into the process chamber 201 via the MFC 241f, the valve 243f, the gas supply pipe 232c and the nozzle 249c. The aminosilane-based precursor gas is a silane-based precursor gas containing an amino group, i.e., an organic precursor gas containing at least Si and an amino group containing C and N. The aminosilane-based precursor gas contains C in gas molecules but does not have an Si—C bond. Even when this type of precursor gas is used, C derived from the precursor gas is less likely to be introduced into a film as formed, as a component of the film. That is, the aminosilane-based precursor gas is a precursor gas serving as an Si source but not serving as a C source. As the aminosilane-based precursor gas, for example, it may be possible to use a bis-tert-butylaminosilane (SiH$_2$[NH(C$_4$H$_9$)]$_2$, abbreviation: BTBAS) gas, a tetrakisdimethylaminosilane (Si[N(CH$_3$)$_2$]$_4$, abbreviation: 4DMAS) gas, a trisdimethylaminosilane (Si[N(CH$_3$)$_2$]$_3$H, abbreviation: 3DMAS) gas, a bisethylmethylaminosilane (Si[N(C$_2$H$_5$)(CH$_3$)]$_2$H$_2$, abbreviation: BEMAS) gas, a bisdiethylaminosilane (Si[N(C$_2$H$_5$)$_2$]$_2$H$_2$, abbreviation: BDEAS) gas or the like.

As a precursor gas, which contains silicon (Si), carbon (C) and a halogen element (fluorine (F), chlorine (Cl), bromine (Br) or the like) as a third precursor gas and which has an Si—C bond, for example, a methylene group-containing chlorosilane-based precursor gas, which is a precursor gas containing Si, a methylene group as an alkylene group and a chloro group as a halogen group, is supplied from the gas supply pipe 232a into the process chamber 201 via the MFC 241a, the valve 243a and the nozzle 249a. The term "methylene group-containing chlorosilane-based precursor gas" refers to a silane-based precursor gas containing a methylene group and a chloro group, i.e., a precursor gas containing at least Si, a C-containing methylene group and Cl as a halogen element. As the methylene group-containing chlorosilane-based precursor gas supplied from the gas supply pipe 232a, for example, it may be possible to use a methylenebis (trichlorosilane) gas, i.e., a bis(trichlorosilyl)methane ((SiCl$_3$)$_2$CH$_2$, abbreviation: BTCSM) gas.

As illustrated in FIG. 4B, BTCSM contains a methylene group as an alkylene group in its chemical structural formula (in one molecule). The methylene group contained in BTCSM has two bonds each boned to Si, thereby forming an Si—C—Si bond. An Si—C bond in the precursor gas is a portion of the Si—C—Si bond contained in, for example, BTCSM, and the methylene group contained in BTCSM contains C constituting such Si—C bond.

Furthermore, the precursor gas containing Si, C and the halogen element and having the Si—C bond may include, for example, an ethylene group-containing a chlorosilane-based precursor gas, which is a precursor gas containing, for example, Si, an ethylene group as an alkylene group and a chloro group as a halogen group. As the ethylene group-containing chlorosilane-based precursor gas, for example, it may be possible to use an ethylenebis (trichlorosilane) gas, i.e., a 1,2-bis(trichlorosilyl)ethane ((SiCl$_3$)$_2$C$_2$H$_4$, abbreviation: BTCSE) gas or the like.

Figure 4C:
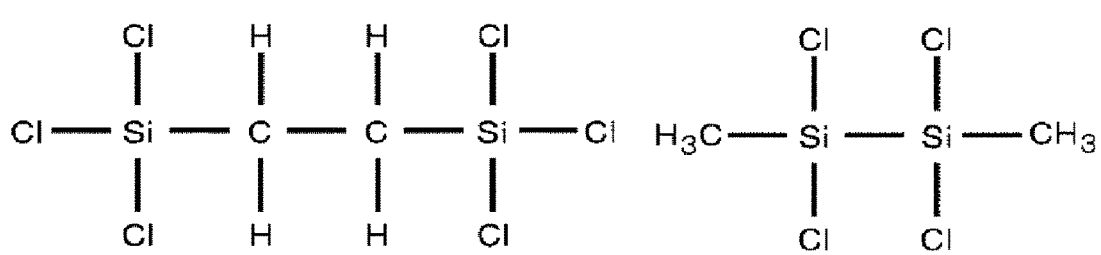
FIG. 4C is a diagram illustrating a chemical structural formula of BTCSE used as a precursor gas.

As illustrated in FIG. 4C, BTCSE contains an ethylene group as an alkylene group in its chemical structural formula (in one molecule). The ethylene group contained in BTCSE has two bonds each bonded to Si, thereby forming an Si—C—C—Si bond. An Si—C bond in the precursor gas is a portion of the Si—C—C—Si bond contained in, for example, BTCSE, and the ethylene group contained in BTCSE contains C constituting such Si—C bond.

Furthermore, the term "alkylene group" refers to a functional group formed by removing two hydrogen (H) atoms from a chain-like saturated hydrocarbon (alkane) represented by a general formula: CnH2n+2. That is, the alkylene group is an aggregate of atoms represented by a general formula: CnH2n. The alkylene group may include a propylene group, a butylene group and the like, in addition to the aforementioned methylene group and ethylene group. Thus, the precursor gas containing Si, C and the halogen element and having the Si—C bond includes an alkylenehalosilane-based precursor gas containing Si, an alkylene group and a halogen element. The alkylenehalosilane-based precursor gas may be said to be an alkylene group-containing a halosilane-based gas, which is a gas having a structure where an alkylene group is introduced to between, for example, Si—Si bonds, with many halogen elements bonded to an Si bond in the halosilane-based precursor gas. The alkylenehalosilane-based precursor gas includes the BTCSM gas, the BTCSE gas and the like.

In addition, the precursor gas containing Si, C and the halogen element and having the Si—C bond may include, for example, a methyl group-containing chlorosilane-based precursor gas, which is a precursor gas containing, for example, Si, a methyl group as an alkyl group and a chloro group as a halogen group. The term "methyl group-containing chlorosilane-based precursor gas" refers to a silane-based precursor gas containing a methyl group and a chloro group, i.e., a precursor gas containing at least Si, a C-containing methyl group and Cl as a halogen element. As the methyl group-containing chlorosilane-based precursor gas, for example, it may be possible to use a 1,1,2,2-tetrachloro-1,2-dimethyldisilane ((CH$_3$)$_2$Si$_2$Cl$_4$, abbreviation: TCDMDS) gas, 1,2-dichloro-1,1,2,2-tetramethyldisilane ((CH$_3$)$_4$Si$_2$Cl$_2$, abbreviation: DCTMDS) gas, 1-monochloro-1,1,2,2,2-pentamethyldisilane ((CH$_3$)$_5$Si$_2$Cl, abbreviation: MCPMDS) gas or the like.

Figure 4D:
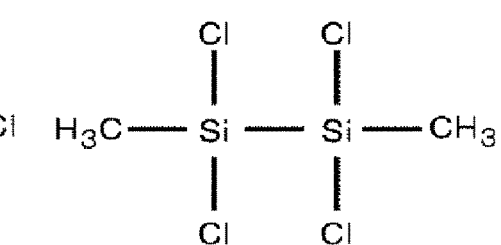
FIG. 4D is a diagram illustrating a chemical structural formula of TCDMDS used as a precursor gas.

As shown in FIG. 4D, TCDMDS contains two methyl groups as alkyl groups in its chemical structural formula (in one molecule). The two methyl groups contained in TCDMDS has bonds each bonded to Si, thereby forming an Si—C bond. An Si—C bond in the precursor gas is an Si—C bond contained in, for example, TCDMDS, and each of the two methyl groups contained in TCDMDS contains C constituting such Si—C bond.

Figure 4E:
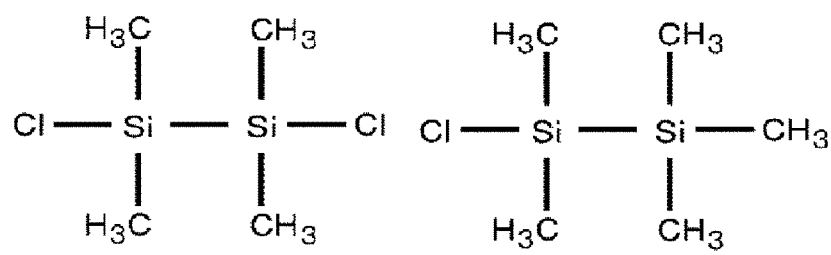
FIG. 4E is a diagram illustrating a chemical structural formula of DCTMDS used as a precursor gas.

As shown in FIG. 4E, DCTMDS contains four methyl groups as alkyl groups in its chemical structural formula (in one molecule). The four methyl groups contained in DCTMDS has bonds each bonded to Si, thereby forming an Si—C bond. An Si—C bond in the precursor gas is an Si—C bond contained in, for example, DCTMDS, and each of the four methyl groups contained in DCTMDS contains C constituting such Si—C bond.

Figure 4F:
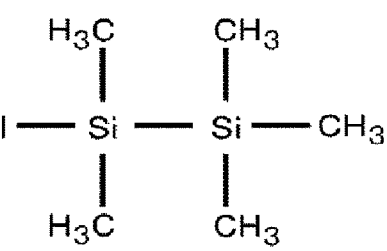
FIG. 4F is a diagram illustrating a chemical structural formula of MCPMDS used as a precursor gas.

As illustrated in FIG. 4F, MCPMDS contains five methyl groups as alkyl groups in its chemical structural formula (in one molecule). The five methyl groups contained in MCPMDS has bonds each bonded to Si, thereby forming an Si—C bond. An Si—C bond in the precursor gas is a portion of the Si—C bond contained in, for example, MCPMDS, and each of the five methyl groups contained in MCPMDS contains C constituting such Si—C bond. Unlike the precursor gases such as the aforementioned BTCSM gas, BTCSE gas, TCDMDS gas, DCTMDS gas and the like, the MCPMDS gas has an asymmetrical structure where arrangement of the methyl groups and chloro groups surrounding Si is asymmetrical in MCPMDS molecules (in its chemical structural formula). Thus, the present embodiment may employ not only precursor gases having the symmetrical chemical structural formulas as illustrated in FIGS. 4A to 4E but also precursor gases having the asymmetrical chemical structural formula.

Furthermore, the term "alkyl group" refers to a functional group formed by removing one H atom from a chain-like saturated hydrocarbon (alkane) represented by a general formula: CnH2n+2. That is, the alkyl group is an aggregate of atoms represented by a general formula: CnH2n+1. The alkyl group may include an ethyl group, a propyl group, a butyl group and the like, in addition to the aforementioned methyl group. Thus, the precursor gas containing Si, C and the halogen element and having the Si—C bond includes an alkylhalosilane-based precursor gas containing Si, an alkyl group and a halogen element. The alkylhalosilane-based precursor gas may be said to be an alkyl group-containing halosilane gas, which is a gas having a structure where some halogen groups of the halosilane-based precursor gas are substituted by alkyl groups. The alkylhalosilane-based precursor gas includes the TCDMDS gas, the DCTMDS gas, the MCPMDS gas and the like.

The BTCSM gas, the BTCSE gas, the TCDMDS gas, the DCTMDS gas and the MCPMDS gas may be referred to as precursor gases containing C, a halogen element (Cl) and at least two Si in one molecule and having an Si—C bond. These gases may also be referred to as precursor gases serving as both of a silicon (Si) source and a carbon (C) source. Use of these types of precursor gases makes it possible to introduce C into a film as formed at a high concentration, as will be described later. On the other hand, as will be described later, an HCDS gas which is a chlorosilane-based precursor gas not containing C in gas molecules, a BTBAS gas which is an aminosilane-based precursor gas containing C but not having an Si—C bond in gas molecules, and the like are precursor gases serving as an Si source but not serving as a C source. Use of these types of precursor gases provides little chance of introducing C into a film as formed, as will be described later.

The precursor gas used herein refers to a gaseous precursor, for example, a gas obtained by vaporizing a precursor which remains in a liquid state under room temperature and atmospheric pressure, or a precursor which remains in a gaseous state under room temperature and atmospheric pressure. When the term "precursor" is used herein, it may refer to "a liquid precursor staying in a liquid state," "a precursor gas staying in a gaseous state," or both. Thus, when the term "halosilane-based precursor (chlorosilane-based precursor)" is used herein, it may refer to a "halosilane-based precursor (chlorosilane-based precursor) staying in a liquid state", a "halosilane-based precursor gas (chlorosilane-based precursor gas) in a gaseous state", or both. When a liquid precursor staying in a liquid state under a normal temperature and an atmospheric pressure, such as BTCSM, BTCSE, TCDMDS, DCTMDS, MCPMDS, HCDS, or BTBAS, is used, the liquid precursor is vaporized by a vaporization system such as a vaporizer or a bubbler, and supplied as a precursor gas (such as a BTCSM gas, a BTCSE gas, a TCDMDS gas, a DCTMDS gas, an MCPMDS gas, an HCDS gas, or a BTBAS gas).

As an oxidizing gas, which is a first reaction gas, for example, a gas containing oxygen (O) (oxygen-containing gas), is supplied from the gas supply pipe 232b into the process chamber 201 via the MFC 241b, the valve 243b, and the nozzle 249b. As the oxidizing gas supplied from the gas supply pipe 232b, for example, it may be possible to use vapor ($H_2O$ gas), which may be generated and supplied by supplying an oxygen ($O_2$) gas and a hydrogen ($H_2$) gas to an external combustion device (not shown).

As an oxidizing gas, which is a second reaction gas, for example, an $O_2$ gas, is supplied from the gas supply pipe 232d into the process chamber 201 via the MFC 241d, the valve 243d, the nozzle 249b, and the buffer chamber 237.

A nitrogen (N)-containing gas (nitrogen-based gas) having, e.g., an electron lone pair, which serves as a catalyst gas having an acid dissociation constant (pKa) of about 1 to 11, specifically 5 to 11, more specifically 5 to 7, is supplied from the gas supply pipe 232c into the process chamber 201 via the MFC 241c, the valve 243c, and the nozzle 249c. Here, the acid dissociation constant (pKa) is one of the indices quantitatively indicating strength of acid and represents an equilibrium constant (Ka) in a dissociation reaction in which hydrogen ions are released from an acid, by a negative common logarithm. The catalyst gas containing N having an electron lone pair weakens a bonding force of O—H bond on the surface of the wafer 200 or of an oxidizing gas such as an $H_2O$ gas by its catalyst action to promote the decomposition of a precursor gas or the like and to promote an oxidation reaction by an $H_2O$ gas or the like. An example of the nitrogen-based gas containing N having an electron lone pair may include an amine-based gas containing amine in which at least one of the hydrogen atoms in ammonia ($NH_3$) is substituted by a hydrocarbon group such as an alkyl group. As the catalyst gas supplied from the gas supply pipe 232c, for example, it may be possible to use a pyridine ($C_5H_5N$) gas which is an amine-based gas.

As illustrated in FIG. 5, various amines used as the catalyst gas may include, for example, aminopyridine ($C_5H_6N_2$, pKa=6.89), picoline ($C_6H_7N$, pKa=6.07), lutidine ($C_7H_9N$, pKa=6.96), pyrimidine ($C_4H_4N_2$, pKa=1.30), quinoline ($C_9H_7N$, pKa=4.97), piperazine ($C_4H_{10}N_2$, pKa=9.80), piperidine ($C_5H_{11}N$, pKa=11.12) and the like, in addition to the pyridine ($C_5H_5N$, pKa=5.67). The various amines illustrated in FIG. 5 may be cyclic amines having cyclic hydrocarbon groups. These cyclic amines may also be referred to as heterocyclic compounds having a cyclic structure formed by plural kinds of elements such as C and N, i.e., nitrogen-containing heterocyclic compounds. These amine-based gases as the catalyst gases may also be referred to as amine-based catalyst gases.

The amine-based gas used herein refers to a gaseous amine gas, for example, a gas obtained by evaporating amine staying in a liquid state under room temperature and atmospheric pressure, or a gas containing amine staying in a gaseous state under room temperature and atmospheric pressure. When the term "amine" is used herein, it may indicate "amine staying in a liquid state", "amine staying in a gaseous state", or both. When amine staying in a liquid state under normal temperature and atmospheric pressure, such as pyridine, aminopyridine, picoline, lutidine, pyrimidine, quinoline, piperazine or piperidine, is used, the amine staying in a liquid state is vaporized by a vaporization system such as a vaporizer or a bubbler, and supplied as an amine-based gas (such as a pyridine gas, an aminopyridine gas, a picoline gas, a lutidine gas, a pyrimidine gas, a quinoline gas, a piperazine gas or a piperidine gas). In contrast, when the amine staying in a gaseous state under normal temperature and atmospheric pressure, such as trimethylamine (($CH_3$)$_3$N, abbreviation: TMA) which will be described later, is used, the amine may be supplied as an amine-based gas (TMA gas) without being vaporized by a vaporization system such as a vaporizer or a bubbler.

As an inert gas, for example, a nitrogen ($N_2$) gas, is supplied from the gas supply pipes 232g to 232j into the process chamber 201 via the respective MFCs 241g to 241j, the respective valves 243g to 243j, the respective gas supply pipes 232a to 232d, the respective nozzles 249a to 249d and the buffer chamber 237. The $N_2$ gas serving as the inert gas acts as a purge gas or a dilution gas. The $N_2$ gas supplied from the gas supply pipe 232j may also act as an assist gas (ignition gas) that assists plasma ignition.

When the aforementioned gases flow from the respective gas supply pipes, a precursor gas supply system for supplying a precursor gas is mainly configured by the gas supply pipes 232a, 232e and 232f, the MFCs 241a, 241e and 241f, and the valves 243a, 243e and 243f. The nozzles 249a and 249c may be regarded as being included in the precursor gas supply system. The precursor gas supply system may also be referred to as a precursor supply system. Furthermore, the precursor gas supply system may be considered as an aggregate of a plurality of supply lines (supply systems) for supplying plural kinds of precursor gases serving as different element sources or plural kinds of precursor gases having different molecular structures. That is, the precursor gas supply system may be considered as an aggregate of a first precursor gas supply line mainly configured by the gas supply pipe 2322, the MFC 241e and the valve 243e, a second precursor gas supply line mainly configured by the gas supply pipe 232f, the MFC 241f and the valve 243f, and a third precursor gas supply line mainly configured by the gas supply pipe 232a, the MFC 241a and the valve 243a. The respective nozzles may be regarded as being included in the corresponding individual supply lines.

Furthermore, a first reaction gas supply system is mainly configured by the gas supply pipe 232b, the MFC 241b and the valve 243b. The nozzle 249b may be regarded as being included in the first reaction gas supply system.

In addition, a second reaction gas supply system is mainly configured by the gas supply pipe 232d, the MFC 241d and the valve 243d. The nozzle 249d and the buffer chamber 237 may be regarded as being included in the second reaction gas supply system.

A reaction gas supply system is configured by the first reaction gas supply system and the second reaction gas supply system.

Moreover, a catalyst gas supply system is mainly configured by the gas supply pipe 232c, the MFC 241c and the valve 243c. The nozzle 249c may be regarded as being included in the catalyst gas supply system. The catalyst gas supply system may also be referred to as an amine-based catalyst gas supply system.

Furthermore, an inert gas supply system is mainly configured by the gas supply pipes 232g to 232j, the MFCs 241g to 241j and the valves 243g to 243j. In addition, the downstream side of the gas supply pipes 232a to 232d from the connection portion with the gas supply pipes 232g to 232j, the nozzles 249a to 249d, and the buffer chamber 237 may be regarded as being included in the inert gas supply system. The inert gas supply system functions also as a purge gas supply system or a dilution gas supply system. The gas supply pipe 232j for supplying an inert gas as an assist gas, the MFC 241j, and the valve 243j may be referred to as an assist gas supply system. The nozzle 249d and the buffer chamber 237 may be regarded as being in the assist gas supply system.

In addition, a plurality of supply lines (supply systems) for supplying plural kinds of gases having different molecular structures may also be installed in supply systems other than the precursor gas supply system such as the reaction gas supply system, the catalyst gas supply system or the like.

(Plasma Source)

As illustrated in FIG. 2, two rod-shaped electrodes 269 and 270 made of a conductive material and having an elongated structure are disposed within the buffer chamber 237 so as to extend along the stacking direction of the wafers 200 from the lower portion to the upper portion of the reaction tube 203. The respective rod-shaped electrodes 269 and 270 are installed parallel to the nozzle 249d. Each of the rod-shaped electrodes 269 and 270 is covered with and protected by an electrode protection tube 275 from the upper portion to the lower portion of the rod-shaped electrodes 269 and 270. One of the rod-shaped electrodes 269 and 270 is connected to a high-frequency power source 273 via a matcher 272 and the other is connected to a ground which is a reference potential. By applying radio-frequency (RF) power from the high-frequency power source 273 to a position between the rod-shaped electrodes 269 and 270 via the matcher 272, plasma is generated in a plasma generation region 224 between the rod-shaped electrodes 269 and 270. A plasma source as a plasma generator (plasma generation part) is mainly configured by the rod-shaped electrodes 269 and 270 and the electrode protection tubes 275. The matcher 272 and the high-frequency power source 273 may be regarded as being included in the plasma source. The plasma source functions as an activation mechanism (excitation part) for activating (or exciting) a gas in a plasma state.

The electrode protection tubes 275 have a structure that enables the respective rod-shaped electrodes 269 and 270 to be inserted into the buffer chamber 237 in a state in which the rod-shaped electrodes 269 and 270 are isolated from the internal atmosphere of the buffer chamber 237. If an O concentration within the electrode protection tubes 275 is substantially equal to an O concentration in the ambient air (atmosphere), the rod-shaped electrodes 269 and 270 respectively inserted into the electrode protection tubes 275 may be oxidized by heat generated from the heater 207. Thus, by filling an inert gas such as an $N_2$ gas into the electrode protection tubes 275 or by purging the interior of the electrode protection tubes 275 with an inert gas such as an $N_2$ gas through the use of an inert gas purge mechanism, it is possible to reduce the O concentration within the electrode protection tubes 275, thereby suppressing the oxidation of the rod-shaped electrodes 269 and 270.

(Exhaust System)

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is a valve configured so that the vacuum exhaust of the interior of the process chamber 201 and the vacuum exhaust stop can be performed by opening and closing the APC valve 243 while operating the vacuum pump 246 and so that the internal pressure of the process chamber 201 can be adjusted by adjusting the opening degree of the APC valve 243 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system. The exhaust pipe 231 is not limited to being installed in the reaction tube 203 but may be installed in the manifold 209 just like the nozzles 249a to 249d.

(Rotation Mechanism and Transfer Mechanism)

A seal cap 219, which serves as a furnace opening cover configured to air-tightly seal a lower end opening of the manifold 209, is installed under the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described later, is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. That is, the boat elevator 115 is configured as a transfer part (transfer mechanism) which transfers the boat 217 and the wafers 200 supported by the boat 217 into and out of the process chamber 201.

(Substrate Support)

The boat 217 serving as a substrate support is made of a heat resistant material such as, e.g., quartz or SiC, and is configured to support a plurality of wafers 200 in such a state that the wafers 200 are arranged in a horizontal posture and in multiple stages with the centers of the wafers 200 aligned with one another. Heat insulating plates 218 made of a heat resistant material such as quartz or SiC are installed below the boat 217 in a horizontal posture and in multiple stages. With this configuration, it is hard for heat generated from the heater 207 to be transferred to the seal cap 219. However, instead of installing the heat insulating plates 218 below the boat 217, a heat insulating tube configured as a tubular member made of a heat resistant material such as quartz or SiC may be installed under the boat 217. As illustrated in FIG. 6, the boat 217 has a wafer arrangement region WA, an upper region space SPU and a lower region space SPL of the wafer arrangement region WA, and a heat insulating plate arrangement region AA. The wafer arrangement region WA is a region formed by arranging product wafers and dummy wafers. The heat insulating arrangement region AA is a region formed by arranging the heat insulating plates 218.

(Temperature Detector)

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a to 249d, the temperature sensor 263 is formed in an L shape. The temperature sensor 263 is installed along the inner wall of the reaction tube 203.

(Controller)

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing such as thin film formation as described hereinbelow, or the like is readably stored in the memory device 121c. The process recipe functions as a program for causing the controller 121 to execute each sequence in a substrate processing process such as a thin film forming process, as described hereinbelow, to obtain a predetermined result. Hereinafter, the process recipe and the control program will be generally and simply referred to as a "program". When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 241a to 241j, the valves 243a to 243j, the pressure sensor 245, the APC valve 244, the vacuum pump 246, the temperature sensor 263, the heater 207, the matcher 272, the high-frequency power source 273, the rotation mechanism 267, the boat elevator 115 and the like, as described above.

The CPU 121a is configured to read the control program from the memory device 121c and execute the same. The CPU 121a also reads the process recipe from the memory device 121c according to an input of an operation command from the input/output device 122. In addition, the CPU 121a is configured to control, according to the contents of the process recipe thus read, the flow rate adjusting operation of various kinds of gases by the MFCs 241a to 241j, the opening/closing operation of the valves 243a to 243j, the opening/closing operation of the APC valve 244, the pressure regulating operation performed by the APC valve 244 based on the pressure sensor 245, the driving and stopping of the vacuum pump 246, the temperature adjusting operation of the heater 207 based on the temperature sensor 263, the operation of rotating the boat 217 with the rotation mechanism 267 and adjusting the rotation speed of the boat 217, the operation of moving the boat 217 up and down with the boat elevator 115, the impedance adjustment operation using the matcher 272, the power supply to the high-frequency power source 273, and the like.

The controller 121 is not limited to being configured as a dedicated computer but may be configured as a general-purpose computer. For example, the controller 121 according to the present embodiment may be configured by installing, on the computer, the aforementioned program stored in an external memory device 123 (for example, a magnetic tape, a magnetic disk such as a flexible disk or a hard disk, an optical disc such as a CD or DVD, a magneto-optical disc such as an MO, a semiconductor memory such as a USB memory or a memory card). However, a means for supplying a program to the computer is not limited to the case of supplying the program through the external memory device 123. For example, the program may be supplied to the computer using a communication means such as the Internet or a dedicated line, instead of using the external memory device 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

(2) Thin Film Forming Step

A sequence example of forming a thin film on a substrate using the processing furnace 202 of the aforementioned substrate processing apparatus, which is one (substrate processing process) of the processes for manufacturing a semiconductor device, will be described below. In the following descriptions, the operations of the respective parts constituting the substrate processing apparatus are controlled by the controller 121.

When the term "wafer" is used herein, it may refer to "a wafer itself" or "a laminated body (aggregate) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

In the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer". In this case, "wafer" may be substituted by "substrate" in the above description.

(Wafer Charge and Boat Load)

If a plurality of wafers 200 is charged on the boat 217 (wafer charging), as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment)

The interior of the process chamber 201 is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information (pressure regulation). The vacuum pump 246 may be continuously activated at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution (temperature adjustment). In addition, the heating of the interior of the process chamber 201 by the heater 207 may be continuously performed at least until the processing of the wafers 200 is completed. However, as will be described later, if the processing of the wafers 200 is performed at room temperature, the heating of the interior of the process chamber 201 by the heater 207 may not be performed. Next, the rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(SiO Film Forming Step According to First Method)

Next, the following two steps are sequentially performed. At an SiO film forming step described hereinbelow, an HCDS gas is used as a first precursor gas, an $H_2O$ gas is used as a first reaction gas, a pyridine gas is used as a catalyst gas, and an $N_2$ gas is used as an inert gas.

[First Step]
(HCDS Gas+Pyridine Gas Supply)

Figure 7:
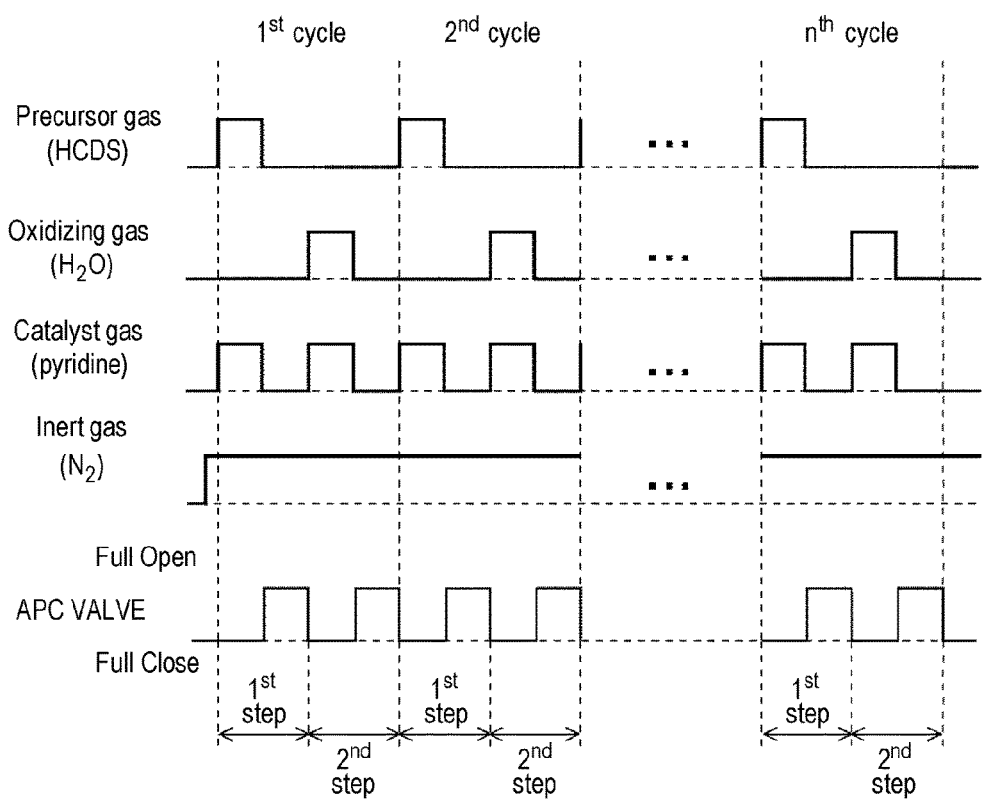
FIG. 7 is a diagram illustrating a gas supply timing in a first film forming sequence (an SiO film forming step according to a first method) of the embodiment of the present disclosure.

As illustrated in FIG. 7, the valve 243e is opened to allow an HCDS gas to flow through the gas supply pipe 232e. The flow rate of the HCDS gas is adjusted by the MFC 241e. The HCDS gas is supplied from the gas supply holes 250a into the process chamber 201 and is exhausted from the exhaust pipe 231. At this time, the HCDS gas is supplied to the wafer 200 (HCDS gas supply). Simultaneously, the valve 243g is opened to allow an inert gas such as an $N_2$ gas to flow through the gas supply pipe 232g. The flow rate of the $N_2$ gas is adjusted by the MFC 241g. The $N_2$ gas is supplied into the process chamber 201 together with the HCDS gas and is exhausted from the exhaust pipe 231.

Furthermore, as illustrated in FIG. 7, the valve 243c is opened to allow a pyridine gas to flow through the gas supply pipe 232c. The flow rate of the pyridine gas is adjusted by the MFC 241c. The pyridine gas is supplied from the gas supply holes 250c into the process chamber 201 and is exhausted from the exhaust pipe 231. At this time, the pyridine gas is supplied to the wafer 200 (pyridine gas supply). Simultaneously, the valve 243i is opened to allow an inert gas such as an $N_2$ gas to flow through the gas supply pipe 232i. The flow rate of the $N_2$ gas is adjusted by the MFC 241i. The $N_2$ gas is supplied into the process chamber 201 together with the pyridine gas and is exhausted from the exhaust pipe 231.

In addition, in order to prevent the HCDS gas and the pyridine gas from entering the nozzles 249b and 249d and the buffer chamber 237, the valves 243h and 243j are opened to allow the $N_2$ gas to flow through the gas supply pipes 232h and 232j. The $N_2$ gas is supplied into the process chamber 201 via the gas supply pipes 232b and 232d, the nozzles 249b and 249d and the buffer chamber 237 and is exhausted from the exhaust pipe 231.

At this time, as illustrated in FIG. 7, the opening degree of the APC valve 244 is set to become fully closed. That is, since the exhaust is stopped, the HCDS gas and the pyridine gas do not flow to the exhaust side. By setting the opening degree of the APC valve 244 to become fully closed, it is possible to simplify the control of the APC valve 244 and also to prolong the lifespan of the APC valve 244. Furthermore, the APC valve 244 is appropriately regulated to set the internal pressure of the process chamber 201 to fall within a range of, for example, 1 to 13,330 Pa, specifically 133 to 2,666 Pa. The supply flow rate of the HCDS gas controlled by the MFC 241a may be set at a flow rate which falls within a range of, for example, 1 to 2,000 sccm, specifically 10 to 1,000 sccm. The supply flow rate of the pyridine gas controlled by the MFC 241c may be set at a flow rate which falls within a range of, for example, 1 to 2,000 sccm, specifically 10 to 1,000 sccm. The supply flow rates of the $N_2$ gas controlled by the MFCs 241g to 241j may be respectively set at a flow rate which falls within a range of, for example, 100 to 10,000 sccm. The time period, during which the HCDS gas and the pyridine gas are supplied to the wafer 200, namely the gas supply time period (the irradiation time period), may be set at a time period which falls within a range of, for example, 1 to 100 seconds, specifically 5 to 60 seconds.

At this time, the temperature of the heater 207 is set such that the temperature of the wafer 200 becomes a temperature, for example, equal to or higher than room temperature and equal to or lower than 150 degrees C., specifically equal to or higher than room temperature and equal to or lower than 100 degrees C., more specifically equal to or higher than 50 degrees C. and equal to or lower than 100 degrees C. If no catalyst gas is supplied at the time of supplying the HCDS gas, when the temperature of the wafer 200 is lower than 250 degrees C., a practical deposition rate may not be obtained because the HCDS is hardly chemisorbed onto the wafer 200. This may be solved by supplying the pyridine gas as the catalyst gas, even when the temperature of the wafer 200 is less than 250 degrees C., as in the present embodiment. Under the existence of the pyridine gas, the amount of heat applied to the wafers 200 can be reduced by setting the temperature of the wafer 200 to become 150 degrees C. or less, further, 100 degrees C. or less, thereby favorably performing the control of thermal history of the wafer 200. Under the existence of the pyridine gas, when the temperature of the wafer 200 is equal to or higher than room temperature, it becomes possible to sufficiently adsorb the HCDS onto the wafer 200 and to obtain a sufficient deposition rate. Thus, the temperature of the wafer 200 may be set at a temperature equal to or higher than room temperature and equal to or lower than 150 degrees C., specifically room temperature to 100 degrees C., more specifically 50 to 100 degrees C.

As described above, by supplying the HCDS gas to the wafer 200, an Si-containing layer containing Cl having a thickness of, for example, approximately less than one atomic layer to several atomic layers is formed as a first layer on the wafer (a base film of the surface of the wafer). The Si-containing layer containing Cl may include an Si layer containing Cl, an adsorption layer of HCDS, or both.

The Si layer containing Cl generally refers to a continuous layer or discontinuous layer made of Si and containing Cl or an Si thin film containing Cl and formed by laminating these continuous and discontinuous layers. The continuous layer made of Si and containing Cl may be sometimes referred to as an Si thin film containing Cl. Si in the Si layer containing Cl includes not only one in which an Si—Cl bond is not completely broken, but also one which an Si—Cl bond is completely broken.

The adsorption layer of HCDS includes not only a continuous adsorption layer of HCDS molecules but also a discontinuous adsorption layer of HCDS molecules. That is, the adsorption layer of HCDS includes an adsorption layer having a thickness of one molecular layer or less constituted by HCDS molecules. The HCDS ($Si_2Cl_6$) molecules constituting the adsorption layer of HCDS include ones in which some of the Si—Cl bonds are broken. That is, the adsorption layer of HCDS may include a chemical adsorption layer of HCDS molecules, a physical adsorption layer of HCDS molecules, or both.

The pyridine gas as the catalyst gas weakens a bonding force of an O—H bond on the surface of the wafer 200 to promote the decomposition of the HCDS gas and to promote the formation of the first layer by chemisorption of HCDS molecules. That is, for example, the pyridine gas as the catalyst gas acts on the O—H bond on the surface of the wafer 200 to weaken a bonding force between O—H bonds. When H with the weakened bonding force reacts with Cl of the HCDS gas, a hydrogen chloride (HCl) gas is generated and desorbed, and HCDS molecules (halide), which lost Cl, are chemisorbed to the surface of the wafer 200. That is, a chemical adsorption layer of HCDS is formed on the surface of the wafer 200. The reason that the pyridine gas weakens the bonding force between O and H is because the N atom having an electron lone pair in the pyridine molecule has an action of attracting H. The magnitude of the action in which a predetermined compound containing an N atom or the like attracts H may be, for example, one of the indexes of the aforementioned acid dissociation constant (pKa).

As described above, pKa is a constant representing an equilibrium constant Ka in a dissociation reaction in which hydrogen ions are released from an acid, by a negative common logarithm, and a compound with large pKa has a strong force attracting H. For example, a compound with pKa of 5 or more as the catalyst gas is used to promote the decomposition of the HCDS gas and to promote the formation of the first layer. On the other hand, if pKa of the catalyst gas is too large, Cl drawn out of HCDS molecules and the catalyst gas are bonded to each other, so that salt (ion compound) such as ammonium chloride ($NH_4Cl$) or the like is generated to become a particle source. In order to inhibit the above problem, pKa of the catalyst gas may be set to become about 11 or less, specifically 7 or less. The pyridine gas has pKa of about 5.67, which is relatively large, and has a strong force of attracting H. Furthermore, since pKa is 7 or less, particles are rarely generated.

As described above, by supplying the pyridine gas as the catalyst gas together with the HCDS gas, even under the condition of low temperature of, for example, 150 degrees C. or lower, it is possible to promote decomposition of the HCDS gas and to form the first layer such that a chemical adsorption layer is dominantly formed without formation of a physical adsorption layer of the HCDS gas.

In addition, as described above, by using the HCDS gas as the precursor gas containing Si and a halogen element, even under the condition of low temperature of, for example, 150 degrees C. or less, Si can be introduced into the first layer. The first layer containing Si is oxidized at step 2a which will be performed later, thereby forming a silicon oxide (SiO) layer or an SiO film formed by laminating these SiO layers.

(Residual Gas Removal)

After the Si-containing layer containing Cl as the first layer is formed on the wafer 200, the valve 243e is closed to stop the supply of the HCDS gas. Furthermore, the valve 243c is closed to stop the supply of the pyridine gas. At this time, as illustrated in FIG. 7, the opening degree of the APC valve 244 of the exhaust pipe 231 may be set to become fully opened and the interior of the process chamber 201 is vacuum-exhausted by the vacuum pump 246. Thus, the unreacted HCDS gas or pyridine gas or the HCDS gas or pyridine gas contributed to the formation of the first layer, which remains within the process chamber 201, are removed from the interior of the process chamber 201 (residual gas removal). In addition, the opening degree of the APC valve 244 may not be set to become fully opened, but if the opening degree of the APC valve 244 is set to become fully opened, it is possible to simplify the control of the APC valve 244 and to prolong the lifespan of the APC valve 244. Furthermore, the supply of the $N_2$ gas as the inert gas into the process chamber 201 is maintained while opening the valves 243g to 243j. The $N_2$ gas acts as a purge gas. This makes it possible to enhance the effect of removing the unreacted HCDS gas or pyridine gas or the HCDS gas or pyridine gas contributed to the formation of the first layer, which remains within the process chamber 201, from the interior of the process chamber 201. Furthermore, a cyclic purge in which the purge and vacuumization are repeated may be performed.

At this time, the gas remaining within the process chamber 201 may not be completely removed and the interior of the process chamber 201 may not be completely purged. If the amount of the gas remaining within the process chamber 201 is small, there is no possibility that an adverse effect is generated at a second step which will be performed later. In this case, it is not necessary to make the flow rate of the $N_2$ gas supplied into the process chamber 201 large. For example, by supplying the $N_2$ gas substantially in the same amount as the volume of the reaction tube 203 (the process chamber 201), it is possible to perform a purge operation such that an adverse effect is not generated at the second step. By not completely purging the interior of the process chamber 201 in this way, it is possible to shorten the purge time and to improve the throughput. In addition, it is possible to suppress the consumption of the $N_2$ gas to a necessary minimum level.

As the first precursor gas, it may be possible to use, in addition to the HCDS gas, a precursor gas containing Si and a halogen element, such as a silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, a monochlorosilane ($SiH_3Cl$, abbreviation: MCS) gas or the like, i.e., a chlorosilane-based precursor gas or the like not containing C in gas molecules. As the catalyst gas, it may be possible to use, in addition to the pyridine gas, an amine-based catalyst gas such as an aminopyridine gas, a picoline gas, a lutidine gas, a pyrimidine gas, a quinoline gas, a piperazine gas, a piperidine gas or the like. As the inert gas, it may be possible to use, in addition to the $N_2$ gas, a rare gas such as an Ar gas, an He gas, an Ne gas, a Xe gas or the like.

[Second Step]
($H_2O$ Gas+Pyridine Gas Supply)

After the first step is completed and the residual gas within the process chamber 201 is removed, as illustrated in FIG. 7, the valve 243b is opened to allow an $H_2O$ gas to flow through the gas supply pipe 232b. The flow rate of the $H_2O$ gas is adjusted by the MFC 241b. The $H_2O$ gas is supplied from the gas supply holes 250b into the process chamber 201 and is exhausted from the exhaust pipe 231. At this time, the HCDS gas is supplied to the wafer 200 under a non-plasma atmosphere ($H_2O$ gas supply). Simultaneously, the valve 243h is opened to allow an $N_2$ gas as an inert gas to flow through the gas supply pipe 232h. The flow rate of the $N_2$ gas is adjusted by the MFC 241h. The $N_2$ gas is supplied into the process chamber 201 together with the $H_2O$ gas and is exhausted from the exhaust pipe 231.

Furthermore, similar to the supply of the pyridine gas at the first step, as illustrated in FIG. 7, the pyridine gas is supplied to the wafer 200 (pyridine gas supply).

In addition, in order to prevent the $H_2O$ gas and the pyridine gas from entering the nozzles 249a and 249d or the buffer chamber 237, the valves 243g and 243j are opened to allow the $N_2$ gas to flow through the gas supply pipes 232g and 232j. The $N_2$ gas is supplied into the process chamber 201 via the gas supply pipes 232a and 232d, the nozzles 249a and 249d and the buffer chamber 237 and is exhausted from the exhaust pipe 231.

At this time, as illustrated in FIG. 7, the opening degree of the APC valve 244 may be set to become fully closed. That is, since the exhaust is stopped, the $H_2O$ gas and the pyridine gas do not flow to the exhaust side. By setting the opening degree of the APC valve 244 to become fully closed, it is possible to simplify the control of the APC valve 244 and to prolong the lifespan of the APC valve 244. In addition, the APC valve 244 is appropriately regulated to set the internal pressure of the process chamber 201 to fall within a range of, for example, 1 to 13,330 Pa, specifically 133 to 2,666 Pa. The supply flow rate of the $H_2O$ gas controlled by the MFC 241b may be set at a flow rate which falls within a range of, for example, 1,000 to 10,000 sccm, specifically 10 to 1,000 sccm. The supply flow rate of the pyridine gas controlled by the MFC 241c may be set at a flow rate which falls within a range of, for example, 1 to 2,000 sccm, specifically 10 to 1,000 sccm. The supply flow rates of the $N_2$ gas controlled by the MFCs 241g to 241j may be respectively set at a flow rate which falls within a range of, for example, 100 to 10,000 sccm. The time period, during which the $H_2O$ gas and the pyridine gas are supplied to the wafer 200, namely the gas supply time period (the irradiation time period), may be set at a time period which falls within a range of, for example, 1 to 100 seconds, specifically 5 to 60 seconds. The temperature of the heater 207 is set such that the temperature of the wafer 200 becomes a temperature which falls within a temperature zone similar to the temperature of the wafer 200 at step 1a. That is, the temperature of the heater 207 may be set, for example, such that the temperature of the wafer 200 is equal to or higher than room temperature and equal to or lower than 150 degrees C., specifically equal to or higher than room temperature and equal to or lower than 100 degrees C., more specifically equal to or higher than 50 degrees C. and equal to or lower than 100 degrees C.

The $H_2O$ gas supplied into the process chamber 201 is thermally activated and is exhausted from the exhaust pipe 231. At this time, the thermally-activated $H_2O$ gas is supplied to the wafer 200. That is, the gas flowing into the process chamber 201 is the thermally-activated $H_2O$ gas, rather than the HCDS gas. Thus, the $H_2O$ gas is supplied to the wafer 200 in an activated state without causing any gaseous reaction and reacts with at least a portion of the first layer (the Si-containing layer containing Cl) formed on the wafer 200 at step 1a. This makes it possible to allow the first layer to be thermally oxidized with non-plasma so as to be changed into a second layer containing Si and O, i.e., an SiO layer.

The pyridine gas as the catalyst gas weakens a bonding force of the O—H bond of the $H_2O$ gas to promote the decomposition of the $H_2O$ gas and the reaction between the $H_2O$ gas and the first layer. That is, the pyridine gas as the catalyst gas acts on the O—H bond of the $H_2O$ gas to weaken a bonding force between O and H. As H with the weakened bonding force reacts with Cl contained in the first layer formed on the wafer 200, an HCl gas is generated and H and Cl are desorbed, and O in the $H_2O$ gas, which lost H, is bonded to Si in the first layer without Cl.

Under the condition of low temperature of, for example, 150 degrees C. or lower, the SiO layer containing a relatively large amount of water ($H_2O$) or an SiO film formed by laminating these SiO layers may be easily formed. The water contained in the SiO layer or the SiO film is derived from, for example, the $H_2O$ gas or the like used as the oxidizing gas.

(Residual Gas Removal)

After the second layer is formed on the wafer 200, the valve 243b is closed to stop the supply of the $H_2O$ gas. Furthermore, the valve 243c is closed to stop the supply of the pyridine gas. At this time, as illustrated in FIG. 7, the opening degree of the APC valve 244 of the exhaust pipe 231 may be set to become fully opened and the interior of the process chamber 201 is vacuum-exhausted by the vacuum pump 246. Thus, the unreacted $H_2O$ gas or pyridine gas, the $H_2O$ or pyridine gas contributed to the formation of the second layer, or the reaction byproduct, which remains within the process chamber 201, are removed from the interior of the process chamber 201 (residual gas removal). Furthermore, the opening degree of the APC valve 244 may not be set to become fully opened, but if the opening degree of the APC valve 244 is set to become fully opened, it is possible to simplify the control of the APC valve 244 and to prolong the lifespan of the APC valve 244. In addition, the supply of the $N_2$ gas as the inert gas into the process chamber 201 is maintained while opening the valves 243g to 243j. The $N_2$ gas acts as a purge gas. This makes it possible to enhance the effect of removing the unreacted $H_2O$ gas or pyridine gas, the $H_2O$ gas or pyridine gas contributed to the formation of the second layer, or the reaction byproduct, which remains within the process chamber 201, from the interior of the process chamber 201. Furthermore, a cyclic purge in which the purge and vacuumization are repeated may be performed.

At this time, the gas remaining within the process chamber 201 may not be completely removed and the interior of the process chamber 201 may not be completely purged. If the amount of the gas remaining within the process chamber 201 is small, there is no possibility that an adverse effect is generated at a first step which will be performed later. In this case, it is not necessary to make the flow rate of the $N_2$ gas supplied into the process chamber 201 large. For example, by supplying the $N_2$ gas substantially in the same amount as the volume of the reaction tube 203 (the process chamber 201), it is possible to perform a purge operation such that an adverse effect is not generated at the first step. By not completely purging the interior of the process chamber 201 in this way, it is possible to shorten the purge time and to improve the throughput. In addition, it is possible to suppress the consumption of the $N_2$ gas to a necessary minimum level.

As the oxidizing gas serving as the first reaction gas, it may be possible to use, in addition to the $H_2O$ gas, a hydrogen peroxide ($H_2O_2$) gas, a hydrogen ($H_2$) gas+an oxygen ($O_2$) gas, an $H_2$ gas+an ozone ($O_3$) gas or the like. As the catalyst gas, it may be possible to use, in addition to the pyridine gas, various amine-based catalyst gases mentioned above. As the inert gas, it may be possible to use, in addition to the $N_2$ gas, various rare gases mentioned above.

(Performing a Predetermined Number of Times)

As illustrated in FIG. 7, the aforementioned first step and second step is set as one cycle and this cycle is performed once or more, namely a predetermined number of times (n times). Thus, an Si film having a predetermined composition and a predetermined film thickness can be formed on the wafer 200. The cycle which non-simultaneously performs the aforementioned first step and second step may be repeated multiple times. That is, the thickness of the SiO layer formed per one cycle may be set smaller than a desired film thickness and the aforementioned cycle may be repeated multiple times until the thickness of the SiO layer becomes equal to the desired film thickness.

At this time, by controlling the processing conditions such as the internal pressure of the process chamber 201, the gas supply time period and the like at each step, the percentage of respective element components, i.e., Si and O components, in the SiO layer, namely the Si concentration and O concentration, can be adjusted and the composition ratio of the SiO film can be controlled.

(Residual Gas Removal and Purge)

Thereafter, the supply of the $N_2$ gas as the inert gas into the process chamber 201 is maintained while opening the valves 243g to 243j. The $N_2$ gas acts as a purge gas. This makes it possible to enhance the effect of removing the unreacted gas or the reaction byproduct, which remain within the process chamber 201, from the interior of the process chamber 201 (purge). As the inert gas, it may be possible to use, in addition to the $N_2$ gas, various rare gases mentioned above.

(Atmospheric Pressure Return)

Even after the interior of the process chamber 201 is purged by the inert gas, by continuously supplying the $N_2$ gas as the inert gas from the respective gas supply pipes 232g to 232j into the process chamber 201 while opening the valves 243g to 243j, the internal atmosphere of the process chamber 201 is substituted by the inert gas (inert gas substitution) and the internal pressure of the process chamber 201 is returned to an atmospheric pressure (atmospheric pressure return).

(Boat Unload and Wafer Discharge)

Thereafter, the seal cap 219 is moved down by the boat elevator 115 to open the lower end of the manifold 209. The processed wafers 200 supported on the boat 217 are unloaded from the lower end of the manifold 209 outside of the reaction tube 203 (boat unloading). Thereafter, the processed wafers 200 are discharged from the boat 217 (wafer discharging).

(SiO Film Forming Step According to Second Method)

A step of forming an SiO film using a BTBAS as a second precursor gas, an $O_2$ gas as a second reaction gas, and an $N_2$ gas as an inert gas will be described.

Similar to the SiO film forming step according to the aforementioned first method, after the wafer charging, the boat loading, and the pressure regulation and temperature adjustment are performed, the following two steps are sequentially performed.

[First Step]

(BTBAS Gas)

Figure 8:
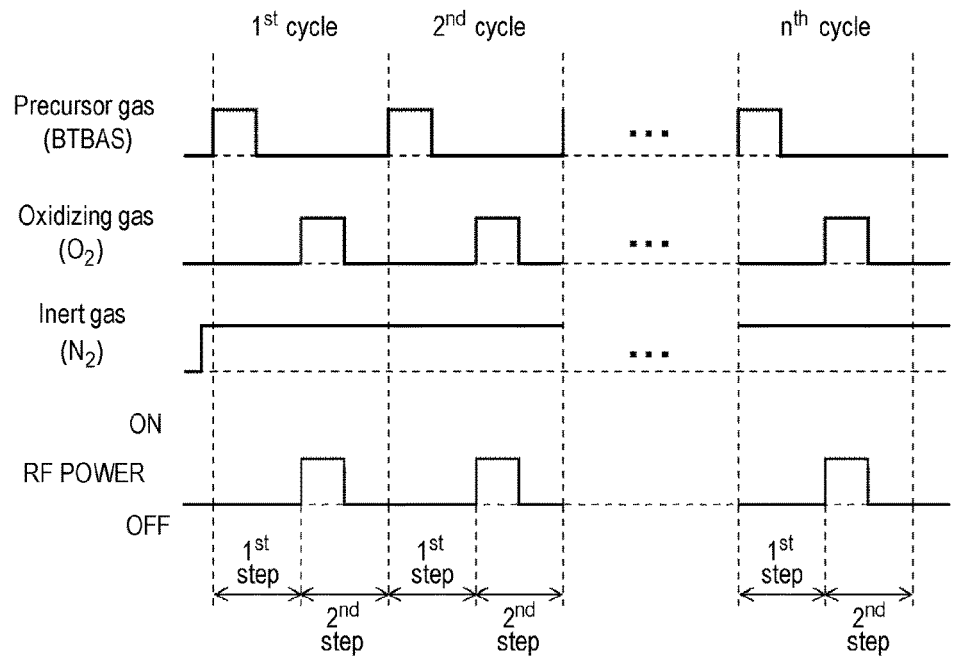
FIG. 8 is a diagram illustrating a gas supply timing in a second film forming sequence (an SiO film forming step according to a second method) of the embodiment of the present disclosure.

As illustrated in FIG. 8, the valve 243f is opened to allow a BTBAS gas to flow through the gas supply pipe 232f The flow rate of the BTBAS gas is adjusted by the MFC 241f The BTBAS gas is supplied from the gas supply holes 250c into the process chamber 201 and is exhausted from the exhaust pipe 231. At this time, the BTBAS gas is supplied to the wafer 200 (BTBAS gas supply). Simultaneously, the valve 243i is opened to allow an inert gas such as an $N_2$ gas to flow through the gas supply pipe 232i. The flow rate of the $N_2$ gas is adjusted by the MFC 241i. The $N_2$ gas is supplied into the process chamber 201 together with the BTBAS gas and is exhausted from the exhaust pipe 231. Furthermore, at this time, similar to the aforementioned embodiment, the supply of the $N_2$ gas is performed in order to prevent the BTBAS gas from entering the unused nozzles 249a, 249b and 249d or the buffer chamber 237.

As described above, by supplying the BTBAS gas to the wafer 200, an Si-containing layer having a thickness of, for example, approximately less than one atomic layer to several atomic layers is formed as a first layer on the wafer 200 (a base film of the surface of the wafer). The Si-containing layer may include an Si layer, an adsorption layer of BTBAS, or both.

The Si layer generally refers to a continuous layer or discontinuous layer made of Si or an Si thin film formed by laminating these continuous and discontinuous layers. The continuous layer made of Si may be sometimes referred to as an Si thin film.

The adsorption layer of BTBAS includes not only a continuous adsorption layer of BTBAS molecules but also a discontinuous adsorption layer of BTBAS molecules. That is, the adsorption layer of BTBAS includes an adsorption layer having a thickness of one molecular layer or less constituted by BTBAS molecules. The BTBAS ($SiH_2[NH(C_4H_9)]_2$) molecules constituting the adsorption layer of BTBAS include ones in which some of Si—H bonds or Si—N bonds are broken. That is, the adsorption layer of BTBAS may include a chemical adsorption layer of BTBAS molecules or a physical adsorption layer of BTBAS molecules.

Furthermore, the processing conditions such as the internal pressure of the process chamber 201, the supply flow rate, the supply time period and the like of each gas at this time may be similar to, for example, those of the sequence of the SiO film forming step according to the aforementioned first method. In addition, the temperature of the wafer 200 may be set at room temperature.

(Residual Gas Removal)

After the Si-containing layer as the first layer is formed on the wafer 200, as illustrated in FIG. 8, the valve 243*f* is closed to stop the supply of the BTBAS gas. The residual gas is removed from the interior of the process chamber 201 under the same procedures as those of the SiO film forming step according to the aforementioned first method.

As the second precursor gas, it may be possible to use, in addition to the BTBAS gas, an aminosilane-based precursor gas such as a 4DMAS gas, a 3DMAS gas, a BEMAS gas, a BDEAS gas or the like.

[Second Step]

($O_2$ Gas)

After the first step is completed and the residual gas within the process chamber 201 is removed, as illustrated in FIG. 8, an $O_2$ gas is supplied to the wafer 200 under the same procedures as those of the SiO film forming step according to the aforementioned first method. At this time, high-frequency power (RF power) is applied from the high-frequency power source 273 to between the rod-shaped electrodes 269 and 270 via the matcher 272, whereby the $O_2$ gas supplied into the buffer chamber 237 is plasma-excited. The plasma-excited $O_2$ gas is supplied as active species from the gas supply hole 250*e* into the process chamber 201 and is exhausted from the exhaust pipe 231. At this time, the plasma-activated (-excited) $O_2$ gas is supplied to the wafer 200 ($O_2$ gas supply). Furthermore, at this time, similar to the aforementioned embodiment, the supply of the $O_2$ gas is performed in order to prevent the $O_2$ gas from entering the unused nozzles 249*a*, 250*b* and 250*c*.

As the plasma-excited $O_2$ gas is supplied to the wafer 200, the plasma-excited $O_2$ gas reacts with at least a portion of the first layer (the Si-containing layer) formed on the wafer 200 at the first step. This makes it possible to allow the first layer to be oxidized so as to be changed into a second layer containing Si and O, i.e., an SiO layer.

Furthermore, the processing conditions such as the internal pressure of the process chamber 201, the supply flow rate, the supply time period and the like of each gas at this time may be similar to, for example, those in the sequence of the SiO film forming step according to the aforementioned first method. In addition, the temperature of the wafer 200 may be set at room temperature.

(Residual Gas Removal)

After the second layer is formed on the wafer 200, as illustrated in FIG. 8, the supply of the $O_2$ gas is stopped and the residual gas is removed from the interior of the process chamber 201 under the same procedures as those of the SiO film forming step according to the aforementioned first method.

(Performing a Predetermined Number of Times)

As illustrated in FIG. 8, the aforementioned first steps and second step are set as one cycle and this cycle is performed once or more, namely a predetermined number of times (n times). Thus, an Si film having a predetermined composition and a predetermined film thickness can be formed on the wafer 200. The cycle which non-simultaneously performs the aforementioned first step and second step may be repeated multiple times. That is, the thickness of the SiO layer formed per one cycle may be set to be smaller than a desired film thickness and the aforementioned cycle may be repeated multiple times until the thickness of the SiO layer becomes equal to the desired film thickness.

At this time, by controlling the processing conditions such as the internal pressure of the process chamber 201, the gas supply time period and the like at each step, the percentage of respective element components, i.e., Si and O components, in the SiO layer, namely the Si concentration and O concentration, can be adjusted and the composition ratio of the SiO film can be controlled.

As described above, it is possible to form an SiO layer or an SiO film by using the aminosilane-based precursor gas as the precursor gas. The aminosilane-based precursor gas is supplied to the wafer 200 without supplying the catalyst gas such as, for example, a pyridine gas or the like. This makes it possible to form the Si-containing layer as the first layer. Thereafter, the first layer is oxidized using an oxygen-containing gas (O-containing gas) such as the plasma-excited $O_2$ as an oxidizing gas to obtain an SiO layer as the second layer. The method of using the plasma-excited O-containing gas or the like as the oxidizing gas can be applied to a case where the aforementioned alkylenehalosilane-based precursor gas or alkylhalosilane-based precursor gas or halosilane-based precursor gas (chlorosilane-based gas) is used as the precursor gas. However, in the case where the alkylenhalosilane-based precursor gas or the alkylhalosilane-based precursor gas is used as the precursor gas, for example, high-frequency power needs to be set at a low value when supplying the oxidizing gas. Even when these silane-based precursor gases are used, the film formation may be performed under the same processing conditions as those in, for example, one of the sequences of the aforementioned embodiment.

(SiOC Film Forming Step According to Third Method)

A step of forming an SiOC film using a BTCSM gas as a third precursor gas, an $H_2O$ gas as a first reaction gas, a pyridine gas as a catalyst gas and an $N_2$ gas as an inert gas will be described.

Similar to the SiO film forming step according to the aforementioned first method, after the wafer charging, the boat loading, and the pressure regulation and temperature adjustment are performed, the following two steps are sequentially performed.

[First Step]

(BTCSM Gas+Pyridine Gas Supply)

Figure 9:
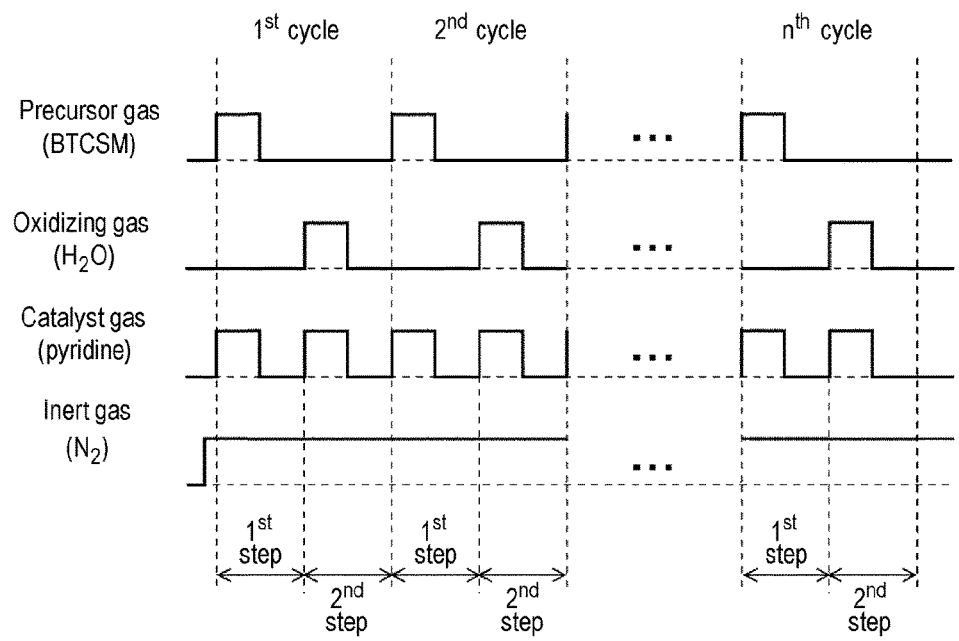
FIG. 9 is a diagram illustrating a gas supply timing in a third film forming sequence (an SiO film forming step according to a third method) of the embodiment of the present disclosure.

As illustrated in FIG. 9, the valve 243*a* is opened to allow a BTCSM gas to flow through the gas supply pipe 232*a*. The flow rate of the BTCSM gas is adjusted by the MFC 241*a*. The BTCSM gas is supplied from the gas supply holes 250*a* into the process chamber 201 and is exhausted from the exhaust pipe 231. At this time, the BTCSM gas is supplied to the wafer 200 (BTCSM gas supply). Simultaneously, the valve 243*g* is opened to allow an inert gas such as an $N_2$ gas to flow through the gas supply pipe 232*g*. The flow rate of the $N_2$ gas is adjusted by the MFC 241*g*. The $N_2$ gas is supplied into the process chamber 201 together with the BTCSM gas and is exhausted from the exhaust pipe 231.

Furthermore, similar to the supply of the pyridine gas of the SiO film forming step according to the aforementioned first method, as illustrated in FIG. 9, the pyridine gas is supplied to the wafer 200. When supplying each gas, similar to the SiO film forming step according to the aforementioned first method, the supply of the $N_2$ gas is performed in order to prevent each gas from entering the unused nozzles 249*b* and 249*d* or the buffer chamber 237.

As described above, by supplying the BTCSM gas to the wafer 200, an Si-containing layer containing C and Cl having a thickness of, for example, approximately less than one atomic layer to several atomic layers is formed as a first layer on the wafer 200 (a base film of the surface of the wafer). The Si-containing layer containing C and Cl may include an Si layer containing C and Cl, an adsorption layer of BTCSM, or both.

The Si layer containing C and Cl generally refers to a continuous layer or discontinuous layer made of Si and containing C and Cl or an Si thin film containing C and Cl and formed by laminating these continuous and discontinuous layers. The continuous layer made of Si and containing C and Cl may be referred to as an Si thin film containing C and Cl. Si in the Si layer containing C and Cl includes not only one in which an Si—C or —Cl bond is completely broken but also one in which an Si—C or —Cl bond is not completely broken.

The adsorption layer of BTCSM includes not only a continuous adsorption layer of BTCSM molecules but also a discontinuous adsorption layer of BTCSM molecules. That is, the adsorption layer of BTCSM includes an adsorption layer having a thickness of one molecular layer or less constituted by BTCSM molecules. The BTCSM (($SiCl_3$)$_2$ $CH_2$) molecules constituting the adsorption layer of the BTCSM include ones in which some of Si—Cl bonds are broken. That is, the adsorption layer of BTCSM may include a chemical adsorption layer of BTCSM molecules or a physical adsorption layer of BTCSM molecules.

The pyridine gas as the catalyst gas weakens a bonding force of an O—H bond on the surface of the wafer 200 to promote the decomposition of the BTCSM gas and to promote the formation of the first layer by chemisorption of BTCSM molecules. That is, for example, the pyridine gas as the catalyst gas acts on the O—H bond on the surface of the wafer 200 to weaken a bonding force between O—H bonds. When H with the weakened bonding force reacts with Cl of the BTCSM gas, a hydrogen chloride (HCl) gas is generated and desorbed, and BTCSM molecules (halide), which lost Cl, is chemisorbed to the surface of the wafer 200. That is, a chemical adsorption layer of BTCSM is formed on the surface of the wafer 200. As described above, the pyridine gas as the catalyst gas also has the same catalyst action with the BTCSM gas as that in the case of using the precursor gas such as the HCDS gas in the SiO film forming step according to the aforementioned first method.

Furthermore, the processing conditions such as the internal pressure of the process chamber 201, the supply flow rate, the supply time period and the like of each gas at this time may be similar to, for example, those in the sequence of the SiO film forming step according to the aforementioned first method.

(Residual Gas Removal)

After the Si-containing layer containing C and Cl as the first layer is formed on the wafer 200, as illustrated in FIG. 9, the valve 243a is closed to stop the supply of the BTCSM gas. Furthermore, as illustrated in FIG. 9, the supply of the pyridine gas is stopped and the residual gas is removed from the interior of the process chamber 201 under the same procedures as those of the SiO film forming step according to the aforementioned first method.

As the third precursor gas, it may be possible to use, in addition to the BTCSM gas, a precursor gas containing Si, C and a halogen element and having an Si—C bond, such as a BTCSE gas, a TCDMDS gas, a DCTMDS gas, an MCP-MDS gas or the like. As the catalyst gas, it may be possible to use, in addition to the pyridine gas, various amine-based catalyst gases mentioned above. As the inert gas, it may be possible to use, in addition to the $N_2$ gas, various rare gases mentioned above.

[Second Step]
($H_2O$ Gas+Pyridine Gas Supply)

After the first step is completed and the residual gas within the process chamber 201 is removed, as illustrated in FIG. 9, an $H_2O$ gas and a pyridine gas are supplied to the wafer 200 under the same procedures as those of the SiO film forming step according to the aforementioned first method. Furthermore, at this time, similar to the aforementioned embodiment, the supply of the $N_2$ gas is performed in order to prevent each gas from entering the unused nozzles 249a and 250d or the buffer chamber 237.

As the thermally-activated $H_2O$ gas is supplied to the wafer 200, the thermally-excited $H_2O$ gas reacts with at least a portion of the first layer (the Si-containing layer containing C and Cl) formed on the wafer 200 at the first step. This makes it possible to allow the first layer to be thermally oxidized with non-plasma so as to be changed into a second layer containing Si, 0 and C, i.e., an SiOC layer.

The pyridine gas as the catalyst gas acts on an O—H bond of the $H_2O$ gas to weaken a bonding force between O—H bonds. When H with the weakened bonding force reacts with Cl contained in the first layer formed on the wafer 200, an HCl gas is generated and H and Cl are desorbed, and O in the $H_2O$ gas, which lost H, is bonded to Si in the first layer without Cl and with at least a portion of C.

In addition, in the step of supplying the $H_2O$ gas and the pyridine gas, the supply amount of the pyridine gas may be appropriately adjusted depending on a desired film composition or the like. If the supply amount of the pyridine gas is increased, the action of the pyridine gas is increased to improve an oxidizing power of the $H_2O$ gas and the Si—C bond is easily broken to desorb C, which results in a decrease of the C concentration in the SiOC layer. If the supply amount of the pyridine gas is decreased, the action of the pyridine gas is weakened to lower the oxidizing power of the $H_2O$ gas and the Si—C bond is easily maintained, which results in an increase of the C concentration in the SiOC layer. Thus, by appropriately adjusting the supply amount of the pyridine gas, it is possible to change the C concentration, Si concentration or O concentration in the SiOC layer, further the SiOC film formed by laminating the SiOC layers in a relative manner.

Furthermore, the processing conditions such as the internal pressure of the process chamber 201, the supply flow rate, the supply time period and the like of each gas at this time may be similar to, for example, those of the sequence of the SiO film forming step according to the aforementioned first method.

Under the condition of low temperature of, for example, 150 degrees C. or less, the SiO layer containing a relatively large amount of water ($H_2O$) or an SiO film formed by laminating these SiO layers may be easily formed. The water contained in the SiO layer or the SiO film is derived from, for example, the $H_2O$ gas or the like used as the oxidizing gas.

(Residual Gas Removal)

After the second layer is formed on the wafer 200, as illustrated in FIG. 8, the supply of the BTCSM gas and the pyridine gas is stopped and the residual gas is removed from the interior of the process chamber 201 under the same procedures as those of the SiO film forming step according to the aforementioned first method.

As the oxidizing gas, it may be possible to use, in addition to the $H_2O$ gas, various gases mentioned above. As the catalyst gas, it may be possible to use, in addition to the pyridine gas, various amine-based catalyst gases mentioned above. As the inert gas, it may be possible to use, in addition to the $N_2$ gas, various rare gases mentioned above.

(Performing a Predetermined Number of Times)

As illustrated in FIG. 9, the aforementioned first step and second step are set as one cycle and this cycle is performed once or more, namely a predetermined number of times (n times). Thus, an SiOC film having a predetermined composition and a predetermined film thickness can be formed on the wafer 200. The cycle which non-simultaneously performs the aforementioned first step and second step may be repeated multiple times. That is, the thickness of the SiOC layer formed per one cycle may be set smaller than a desired film thickness and the aforementioned cycle may be repeated multiple times until the thickness of the SiOC layer becomes equal to the desired film thickness.

At this time, by controlling the processing conditions such as the internal pressure of the process chamber 201, the gas supply time period and the like at each step, the percentage of respective element components, i.e., Si and O components, in the SiO layer, namely the Si concentration, O concentration and C concentration, can be adjusted and the composition ratio of the SiO film can be controlled.

The substrate processing apparatus of this embodiment may include a plurality of gas supply lines for each of the gases such as the precursor gas, the catalyst gas, the reaction gas and the like and may also be configured to supply a particular gas selected from multiple kinds of gases having different molecular structures. With this apparatus configuration, it is easy to supply a particular precursor gas, catalyst gas, oxidizing gas or modifying gas selected from the multiple kinds of gases depending on a desired film composition or the like. Accordingly, it is possible for a single substrate processing apparatus to form general-purposed thin films of different composition ratios and qualities with high reproducibility. In addition, it is possible to secure a degree of freedom of apparatus operability for addition or replacement of gas species.

In the substrate processing apparatus of this embodiment, process recipes (programs describing processing procedures and processing conditions) used for film formation may be prepared for different kinds of gases, i.e., different gas systems. In addition, in the substrate processing apparatus of this embodiment, a plurality of process recipes may be prepared for different processing conditions, such as setting the supply amount or flow rate of each gas such as the catalyst gas to different numerical values. With these process recipes, it is easy to select a particular precursor gas, catalyst gas, or reaction gas from the multiple kinds of gases and select a flow rate or the like thereof, depending on a desired film composition, film quality, film thickness or the like, and supply the same. An operator may properly select an appropriate process recipe from the process recipes depending on the desired film composition or the like to perform a film forming process. Accordingly, it is possible for a single substrate processing apparatus to form general-purpose thin films of different composition ratios, qualities and thicknesses with high reproducibility. In addition, it is possible to reduce an operator's operation burden (a burden borne by an operator when inputting processing procedures or processing conditions) and to quickly start the substrate processing while avoiding an operation error.

In the aforementioned embodiment, there has been described an example in which the SiO film, the SiOC film and the like as thin films are formed. Among these thin films, a laminated film formed by laminating thin films having different compositions or a laminated film formed by laminating the thin films and thin films having compositions different from those of the thin films, may be formed. The laminated film may include, for example, a laminated film of an SiO film and an SiOC film, and the like.

The aforementioned embodiment is not limited to the case where the Si-based thin film is formed as a semiconductor-based thin film such as the aforementioned SiO film or SiOC film, but may be applied to, e.g., a case of forming a metal-based thin film, such as a metal element such as titanium (Ti), zirconium (Zr), hafnium (Hf), tantalum (Ta), aluminum (Al), or molybdenum (Mo), a metal oxide film (metal oxide) containing O, and a metal oxycarbide film (metal oxycarbide) containing C. For example, a TiO film may be formed by the sequence similar to that of the SiO film forming step according to the first method using a $TiCl_4$ gas as a precursor gas, an $H_2O$ gas as a reaction gas, and a pyridine gas as a catalyst gas of the $H_2O$ gas. However, when the $TiCl_4$ gas is supplied, there is no need to supply the catalyst gas as in the case of supplying the BTBAS gas.

Process recipes (programs in which processing procedures and processing conditions are described) used for formation of these various thin films may be prepared individually (prepared in a plural number) according to the contents (the kind, composition ratio, quality, and film thickness of the thin film as formed) of substrate processing. Further, at the start of substrate processing, the CPU 121a may properly select an appropriate recipe from the recipes according to the contents of substrate processing. Specifically, the process recipes prepared individually according to the contents of substrate processing may be stored (installed) in advance in the memory device 121c via a telecommunication line or a recording medium (the external memory device 123) in which the corresponding process recipe is stored. Further, at the start of substrate processing, the CPU 121a may properly select an appropriate recipe from the process recipes stored in the memory device 121c according to the contents of substrate processing. With this configuration, it is possible for a single substrate processing apparatus to form general-purpose films of different kinds, composition ratios, qualities and thicknesses with enhanced reproducibility. In addition, it is possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing recipes already installed in the substrate processing apparatus. When modifying the process recipes, the modified recipes may be installed in the substrate processing apparatus via a telecommunication line or a recording medium storing the process recipes. In addition, the existing recipes already installed in the substrate processing apparatus may be directly modified by operating the input/output device 122 of the existing substrate processing apparatus.

In the film forming sequence of the aforementioned embodiment, there has also been described an example of forming the SiOC film at room temperature. In this case, there is no need to heat the interior of the process chamber 201 with the heater 207 and no heater may be installed in a substrate processing apparatus which performs film formation only at room temperature. This makes it possible to simplify the configuration of the heating system of the substrate processing apparatus and to construct the substrate processing apparatus with a cheaper and simpler structure.

Furthermore, in the aforementioned embodiment, there has been described an example in which thin films are formed using a substrate processing apparatus provided with a hot-wall-type processing furnace. The present disclosure is not limited thereto but may be suitably applied to a case where thin films are formed using a substrate processing apparatus provided with a cold-wall-type processing furnace. Even in this substrate processing apparatus, the processing conditions may be similar to, for example, those in one of the sequences of the aforementioned embodiment.

As described above, the present embodiment is directed to a technique effective for controlling a deposition amount of an ultra-thin film, as a method (film forming method of the embodiment) in which a film is formed by alternately supplying two or more predetermined precursor gases and performing the alternative supply a predetermined number of times, in the semiconductor film forming process.

In the silicon oxide film formed at a low temperature range of, for example, 100 degrees C. or lower according to the film forming method of the embodiment, in the case where a film is formed in the processing furnace such as the substrate processing apparatus of the embodiment, a film-forming gas does not reach the center of the wafer in the upper portion and lower portion of the wafer arrangement region and the film thickness around the wafer tends to be increased. That is, in this substrate processing apparatus, due to an influence of a gas flow in a space from the upper portion and lower portion of the process chamber, the in-plane film thickness distribution of a film formed on the wafer in the upper portion and lower portion of the wafer arrangement region has a strong tendency to become concave (i.e., the film thickness around the wafer is greater than that at the center of the wafer). Thus, the in-plane film thickness distribution of the film formed on the wafer at the central portion of the wafer arrangement region tends to become convex (i.e., the film thickness around the wafer is smaller than that at the center of the wafer). As described above, since the tendency of the in-plane film thickness distribution is different depending on a place within the process chamber, it is difficult to control uniformity.

Figure 10A:
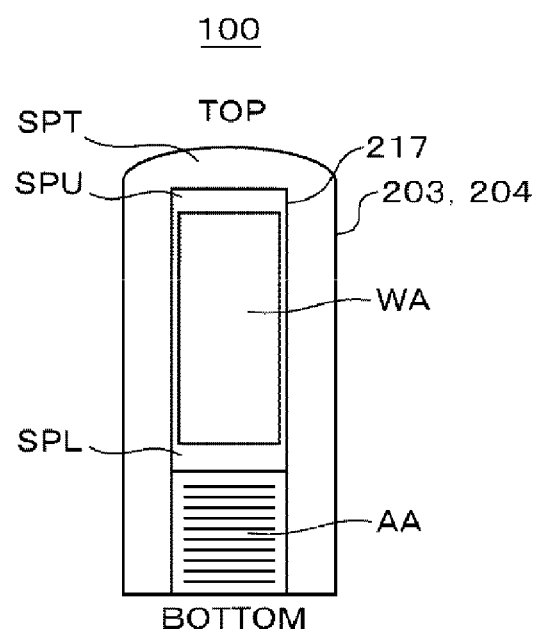
FIG. 10A is a cross sectional view schematically illustrating an internal configuration of a process vessel of the substrate processing apparatus according to the embodiment.

This is because, as illustrated in FIGS. 10A and 10B, spaces (upper spaces) SPT and SPU are present between the ceiling of the process vessel 204 (reaction tube 203) of the substrate processing apparatus 100 and the boat 217 or in the upper portion of the boat 217, and thus, the film-forming gas flows into the upper spaces SPT and SPU to allow for a decrease in the flow velocity of the film-forming gas flowing toward the wafer disposed in the upper side of the boat 217. Furthermore, this is because, as illustrated in FIGS. 10A and 10B, a space SPL is present between the wafer arrangement region WA and a heat insulating plate arrangement region AA, and thus, the film-forming gas flows into the space SPL to allow for a decrease in the flow velocity of the film-forming gas flowing toward the wafer disposed on the lower side of the boat 217.

In addition, this problem is particularly obvious in a case where the precursor gas is supplied in an unsaturated region. That is, this tendency is particularly remarkable when the supply of the precursor gas is performed by a short pulse such that adsorption of a precursor to the surface of the substrate is unsaturated (such that an adsorption layer of a precursor formed on the surface of the substrate becomes a discontinuous layer).

Thus, the flow velocity of the film-forming gas flowing toward the wafer is set to increase (the amount the film-forming gas is set to increase) by blocking the space (by making the space as small as possible) into which the film-forming gas flows.

Hereinafter, examples of blocking the space (making the space as small as possible) into which the film-forming gas flows will be described.

EXAMPLE 1

Figure 11A:
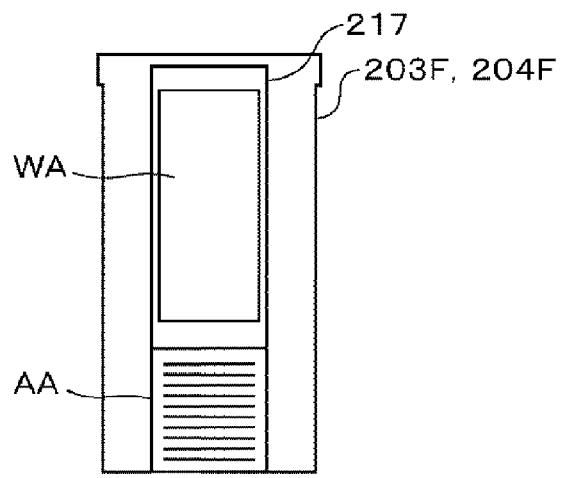
FIG. 11A is a cross sectional view schematically illustrating an internal configuration of a process vessel of a substrate processing apparatus according to example 1.
Figure 11B:
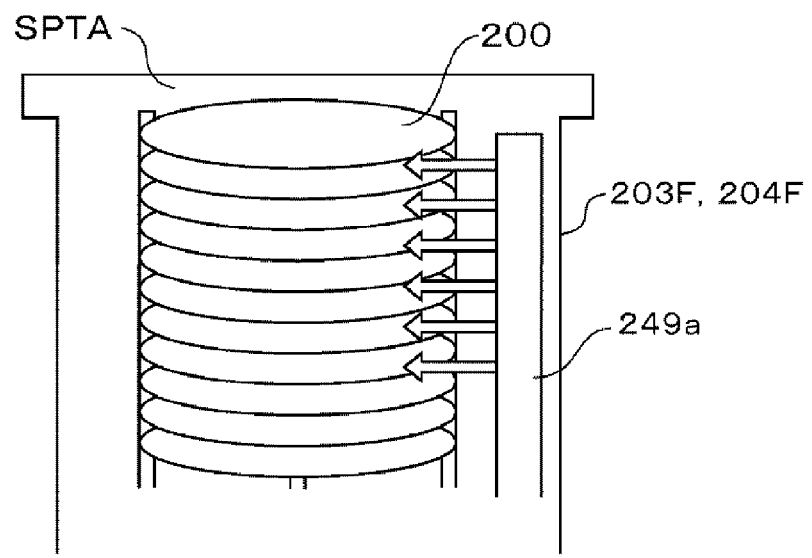
FIG. 11B is a cross sectional view schematically illustrating a flow of a gas within the process vessel of the substrate processing apparatus according to example 1.

A substrate processing apparatus according to a first example (example 1) will be described with reference to FIGS. 11A and 11B.

In a substrate processing apparatus 100A according to example 1, an inner wall surface of the ceiling of the process vessel 204F (reaction tube 203F) is horizontal and flat. Furthermore, other components of the substrate processing apparatus 100A are similar to those of the substrate processing apparatus 100 according to the aforementioned embodiment. With this configuration, a space SPTA between the ceiling of the process vessel 204F (reaction tube 203F) and the boat 217 can be narrowed. By narrowing the space SPTA, it is possible to reduce the amount of the film-forming gas flowing into the space SPTA and to suppress a decrease in the flow velocity of the film-forming gas flowing toward the wafer disposed on the upper side of the boat 217.

[Evaluation of Film Thickness Uniformity]

An evaluation of film thickness uniformity of a film formed by the substrate processing apparatus according to example 1 will be described with reference to FIGS. 12 to 15. A 300 mm$\varphi$ wafer was disposed in the wafer arrangement region WA and an SiO film was formed by the sequence of the SiO film forming step according to the first method of the aforementioned embodiment to perform an evaluation. As illustrated in FIG. 12, after a process gas was vented at step S1, an HCDS gas and a pyridine gas were supplied at step S2. At step S2, the internal pressure of the process chamber 201 was set at Ps. Furthermore, in the drawing, the solid line indicates a set pressure (set), and the broken line indicates a monitor pressure (Mon). A maximum value of pressure monitored during the time period of step S2 was $P_1$ ($<$Ps). The reason for $P_1$ ($<$Ps) is because the time period of step S2 was short and the amount of supplied process gas was small. As described above, when the supply of the process gas was performed by the short pulse, the adsorption of HCDS onto the surface of the wafer was unsaturated. That is, an adsorption layer of HCDS formed on the surface of the wafer becomes discontinuous. At step S3, the interior of the process chamber 201 was purged and the gas remaining within the process chamber 201 was removed. In addition, a minimum value of pressure monitored during this time period was $P_2$ ($<P_1$). At step S4, an H$_2$O gas and a pyridine gas were supplied. At step S4, the internal pressure of the process chamber 201 was set at Ps, a maximum value of pressure monitored during this time period was $P_3$ ($<$Ps) ($P_1<P_3<$Ps). The reason for $P_3$ ($<$Ps) is because the time period of step S4 was short and the amount of supplied process gas was small. At step S5, the interior of the process chamber 201 was purged and the gas remaining within the process chamber 201 was removed. A minimum value of pressure monitored during this time period was $P_2$. Steps S2 to S5 were set as one cycle and this cycle was performed a plurality of times to form an SiO film on the wafer.

Figure 13A:
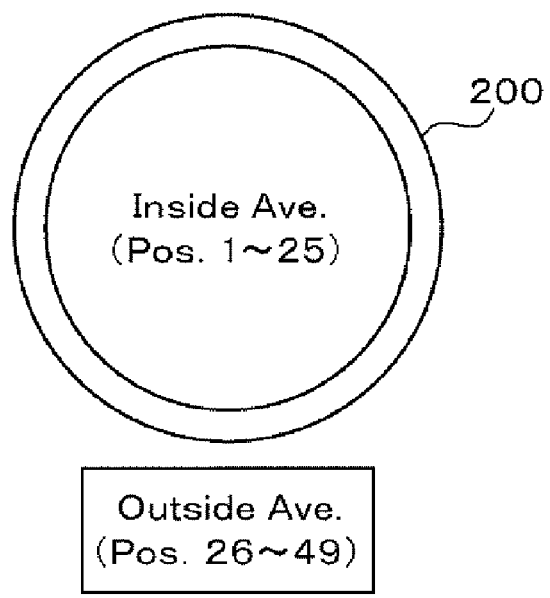
FIG. 13A is a diagram illustrating a method of calculating a film thickness uniformity index.

As illustrated in FIG. 13A, film thickness values measured at 49 points on the wafer surface were divided into those of an inner peripheral portion (1 to 25 points) and an outer peripheral portion (26 to 49 points) to calculate each average value, and the difference was divided by an average value at all the points and indicated by ±% and used as a film thickness uniformity index (hereinafter, referred to as inside-outside uniformity (IOU)). That is, the IOU is calculated as Eq. (1) below.

IOU [%]={(average of inner peripheral portion−average of outer peripheral portion)/overall average}×100   Eq. (1)

Figure 13B:
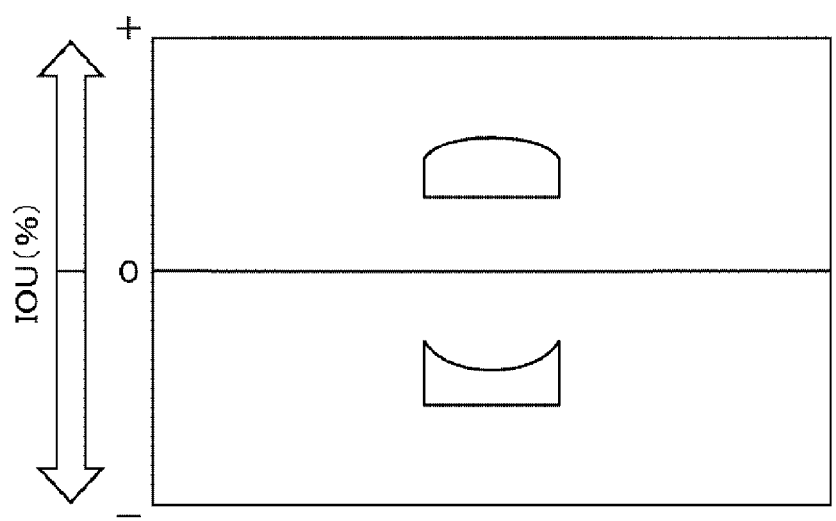
FIG. 13B is a diagram illustrating a tendency of film thickness uniformity index.

As illustrated in FIG. 13B, when the IOU has a positive (+) direction, the in-plane film thickness distribution has an in-plane convex tendency, and when the IOU has a negative (−) direction, the in-plane film thickness distribution has an in-plane concave tendency.

Figure 14:
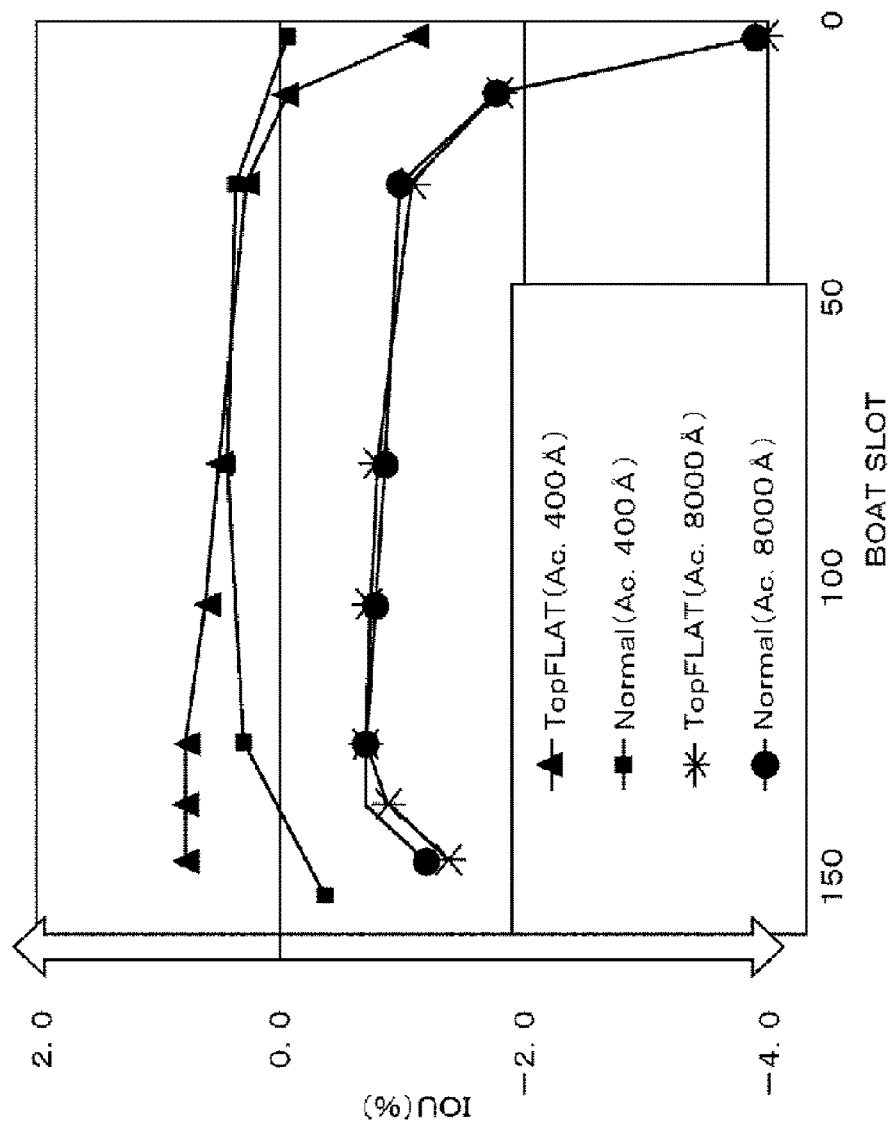
FIG. 14 is a diagram illustrating a film thickness uniformity index distribution of a film formed by the substrate processing apparatus according to example 1.
Figure 15:
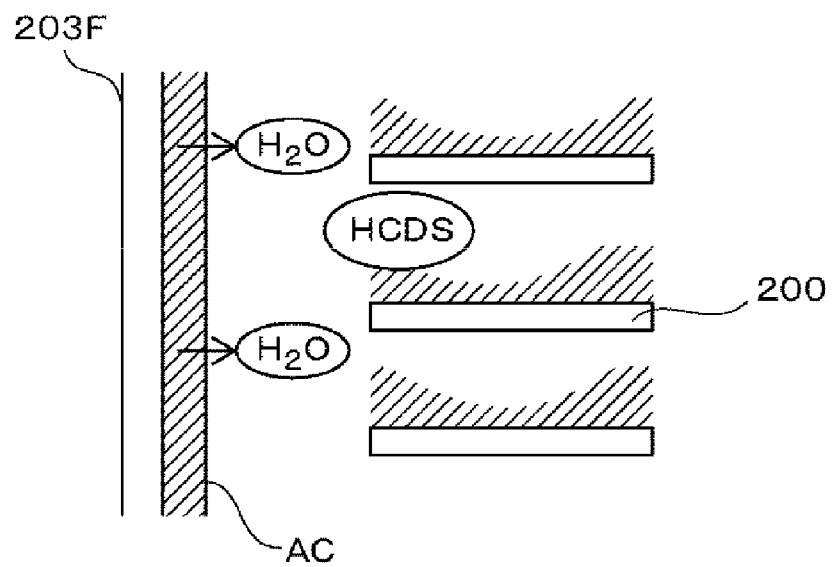
FIG. 15 is a diagram illustrating influence of deposits adhered to an inner wall of the process vessel.

In FIG. 14, the vertical axis represents the IOU, the horizontal axis represents a monitor position in the interplane direction of the boat, and "150" of the boat slot is positioned on the upper side of the process chamber 201 and "0" of the boat slot is positioned on the lower side of the process chamber 201. As illustrated in FIG. 14, in the substrate processing apparatus 100A (reaction tube (top FLAT) having an upper flat structure) according to example 1, it can be seen that the flow of a gas is improved when an accumulated film thickness is about 400 Å (40 nm) (Ac. 400 Å), and the film thickness distribution on the upper side is changed in a convex direction so as to be improved, compared with the substrate processing apparatus 100 (general reaction tube (Normal)). Furthermore, the film thickness distribution on the lower side was not improved. The accumulated film thickness used herein refers to a thickness of deposits adhered to the inner wall or the like of the process vessel (reaction tube). However, it can be seen that, when the accumulated film thickness is about 8,000 Å (800 nm) (Ac. 8,000 Å), there is no difference between the substrate processing apparatus 100A and the substrate processing apparatus 100 and the effect of the reaction tube having the upper flat structure becomes invisible. This is considered to be because of an influence due to desorption of water ($H_2O$) from the deposits AC adhered to the inner wall of the reaction tube 203F, as illustrated in FIG. 15. That is, when the silicon source gas (HCDS gas) is supplied, water ($H_2O$) desorbed from the deposits AC adhered to the inner wall of the reaction tube 203F and the HCDS gas are mixed to cause a CVD reaction to occur. By this CVD reaction, the HCDS gas is consumed in the peripheral portion of the wafer, and thus, the HCDS gas does not reach the central portion of the wafer. Due to this, it is considered that the film thickness in the peripheral portion of the wafer is increased and the film thickness distribution is changed to a concave distribution. Even when the accumulated film thickness is 400 Å, there is an influence of water desorption from the deposits but it is small. This is considered to be because, when the accumulated film thickness is small, the amount of water desorbed from the deposits is small. On the other hand, when the accumulated film thickness is 8000 Å, the influence is large. This is considered to be because, when the accumulated film thickness is large, the amount of water desorbed from the deposits is large.

EXAMPLE 2

Figure 16A:
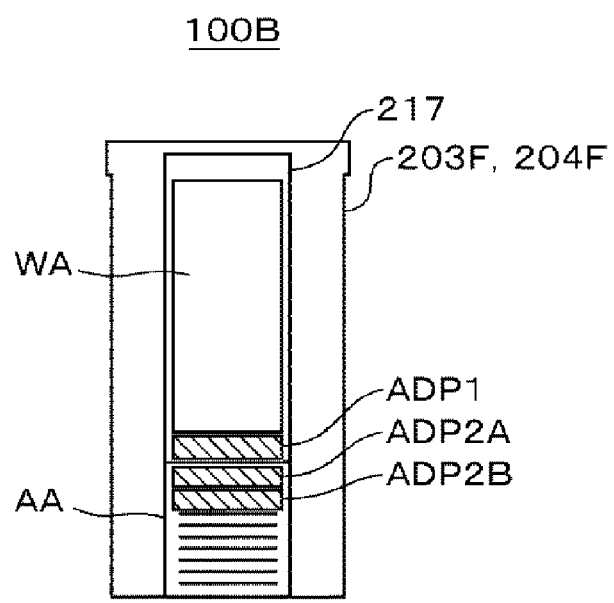
FIG. 16A is a cross sectional view schematically illustrating an internal configuration of a process vessel according to example 2.
Figure 16B:
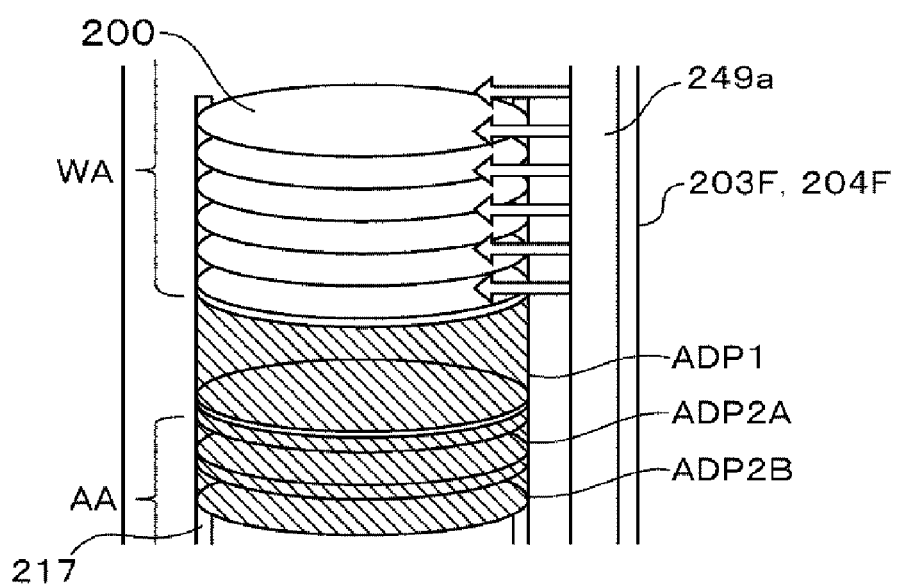
FIG. 16B is a cross sectional view schematically illustrating a flow of a gas within the process vessel of a substrate processing apparatus according to example 2.

A substrate processing apparatus according to a second example (example 2) will be described with reference to FIGS. 16A and 16B.

Similar to example 1, in a substrate processing apparatus 100B according to example 2, the inner wall surface of the ceiling of the process vessel 204F (reaction tube 203F) is horizontal and flat. In addition, the space SPL between the wafer arrangement region WA and the heat insulating plate arrangement region AA is blocked by an adapter ADP1, and the upper side of the heat insulating plate arrangement region AA is blocked by adapters ADP2A and ADP2B, instead of the heat insulating plate 218. Furthermore, other components of the substrate processing apparatus 100B are similar to those of the substrate processing apparatus 100 according to the aforementioned embodiment. With this configuration, the space SPTA between the upper portion of the process vessel 204F (reaction tube 203F) and the boat 217 can be reduced, and a space below the wafer arrangement region WA (a gap between the space SPL and the heat insulating plate 218 on the upper side of the heat insulating plate arrangement region AA) can be reduced. By narrowing the space SPTA, it is possible to reduce the amount of the film-forming gas flowing into the space SPTA and to suppress a decrease in the flow velocity of the film-forming gas flowing toward the wafer disposed on the upper side of the boat 217. In addition, by narrowing (reducing) the space below the wafer arrangement region WA, it is possible to reduce the amount of the film-forming gas flowing into the space SPL and to suppress a decrease in the flow rate of the film-forming gas flowing toward the wafer disposed on the lower side of the boat 217.

Figure 17:
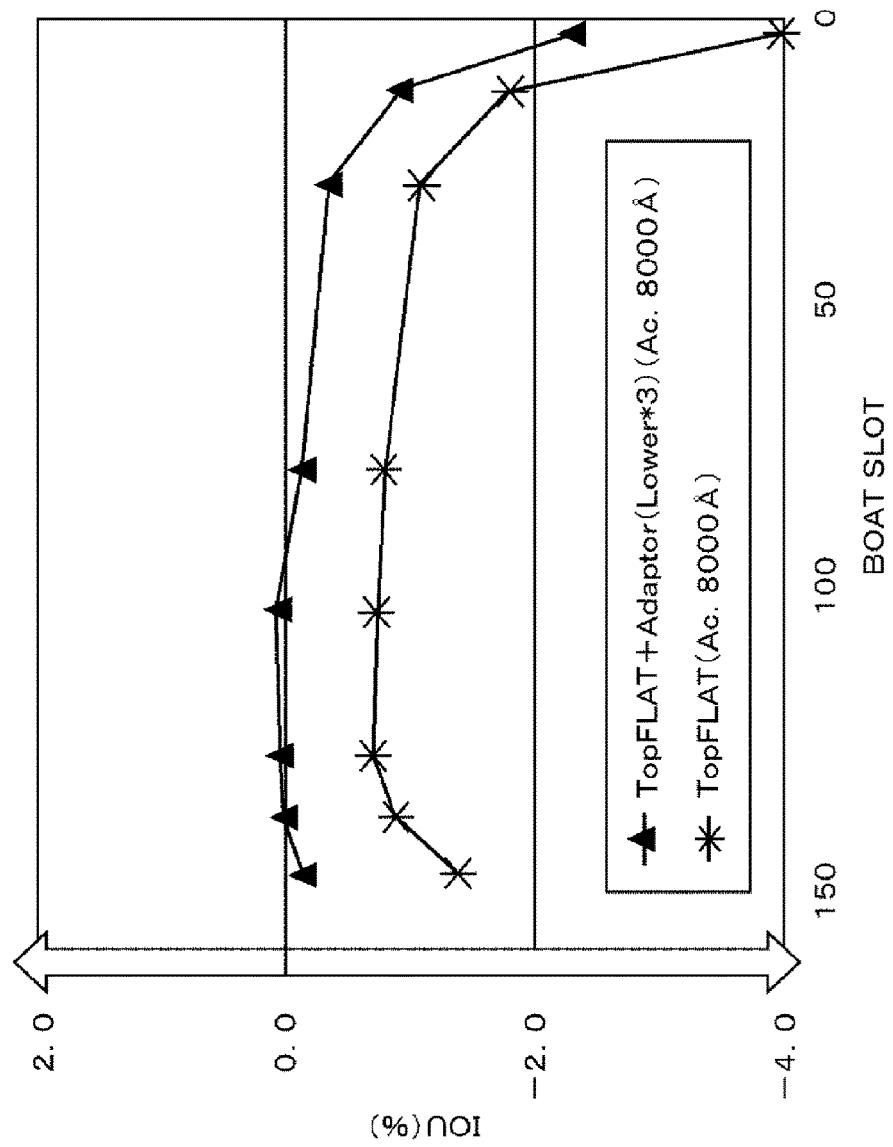
FIG. 17 is a diagram illustrating a film thickness uniformity index distribution of a film formed by the substrate processing apparatus according to example 2.

As illustrated in FIG. 17, in the case of combining the reaction tube having the upper flat structure of example 1 and the adapter burying the space below the wafer arrangement region WA (Top Flat+Adapter (Lower*3)), it can be seen that the film thickness distribution is changed in a convex direction in the entire zone so as to be improved. Since the upper side of the boat 217, as well as the lower side of the boat 217, is improved, it is considered that, as the space below the wafer arrangement region WA is removed, the increase in the flow velocity of the precursor gas on the lower side of the boat 217, elimination of escape of a gas to the space below the wafer arrangement region WA, and the increase in the spreading of a gas to the upper side of the boat 217 are major factors and that the film thickness distribution was improved in a convex direction in the entire zone. In addition, since the space is narrowed (reduced) by loading (charging) the adapters on the boat 217, there is no need to change the configuration of the boat 217.

EXAMPLE 3

Figure 18:
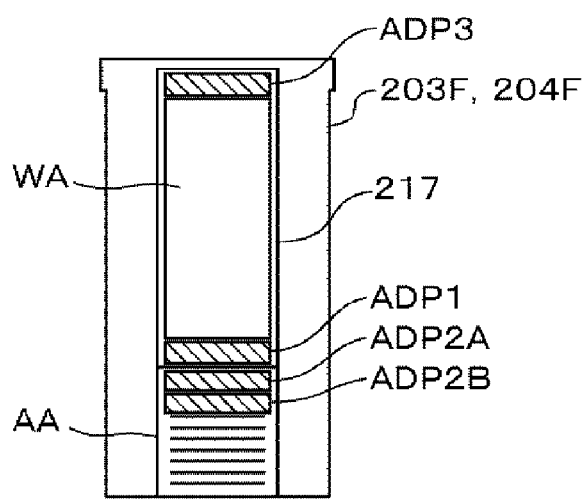
FIG. 18 is a cross sectional view schematically illustrating an internal configuration of a process vessel according to example 3.

A substrate processing apparatus according to a third example (example 3) will be described with reference to FIG. 18.

Similar to example 2, in a substrate processing apparatus 100C according to example 3, the inner wall surface of the ceiling of the process vessel 204F (reaction tube 203F) is horizontal and flat. The space SPL between the wafer arrangement region WA and the heat insulating plate arrangement region AA is blocked by the adapter ADP1, and the upper side of the heat insulating plate arrangement region AA is blocked by the adapters ADP2A and ADP2B, and in addition, the space SPU above the heat insulating plate arrangement region AA is also blocked by an adapter ADP3. Furthermore, other components of the substrate processing apparatus 100C are similar to those of the substrate processing apparatus 100 according to the aforementioned embodiment. With this configuration, it is possible to reduce the space SPTA between the ceiling of the process vessel 204F (reaction tube 203F) and the boat 217, and to reduce the space SPU above and the space below the wafer arrangement region WA (the gap between the space SPL and the heat insulating plate 218 on the upper side of the heat insulating plate arrangement region AA).

Figure 19:
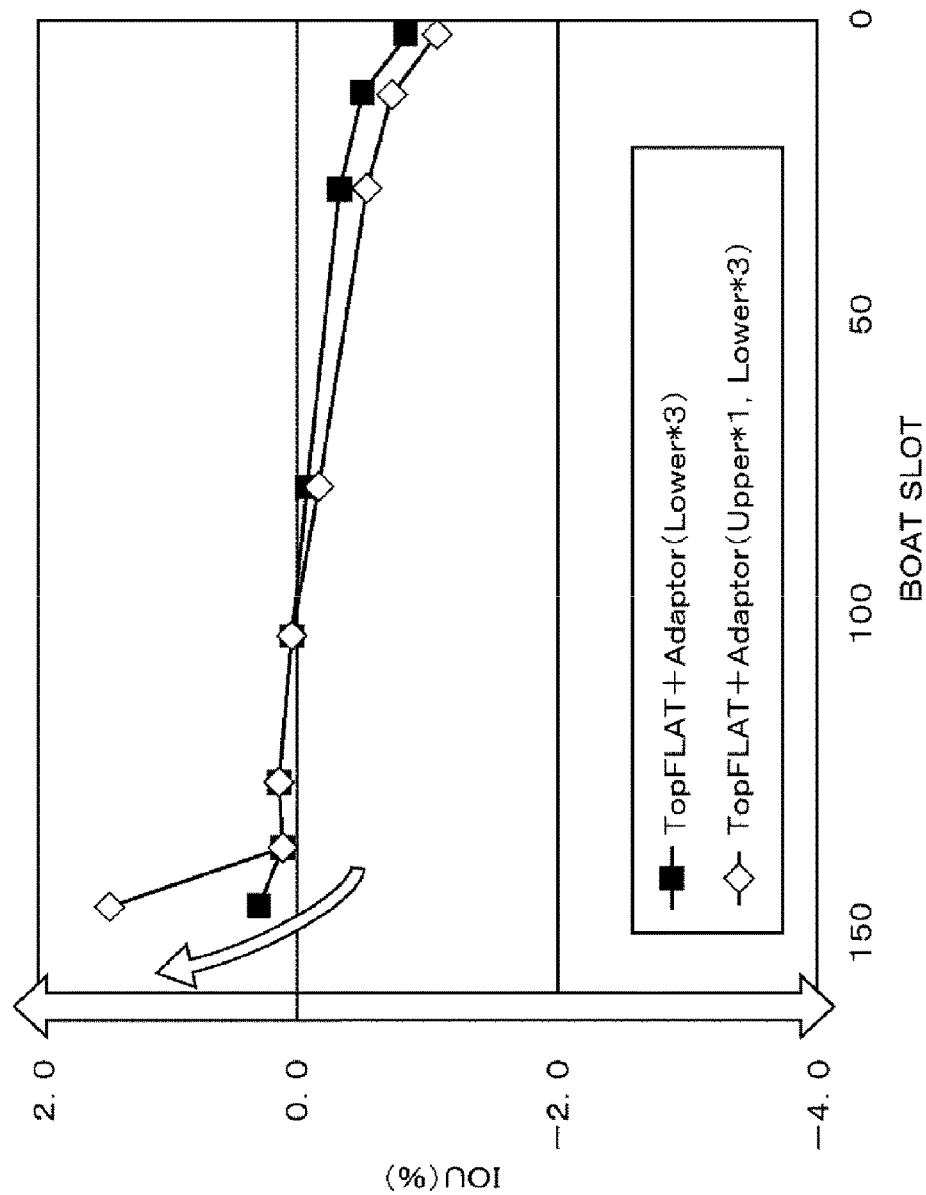
FIG. 19 is a diagram illustrating a film thickness uniformity index distribution of a film formed by the substrate processing apparatus according to example 3.

As illustrated in FIG. 19, in the case of combining the reaction tube having the upper flat structure and the adapters burying the space above and the space below the wafer arrangement region WA (Top Flat+Adapter (Upper*1, Lower*3)), it can be seen that the film thickness distribution of the upper side of the boat 217 is changed in a more convex direction so as to be improved.

In FIG. 19, when the adapter is not installed in the space SPU above the wafer arrangement region WA (Top Flat+Adaptor (Lower*3)), the balance of uniformity is better. However, it is considered that this configuration is advantageous for a process in which the concave tendency is extremely strong on the upper side of the boat 217. Furthermore, similar to example 2, since the space is narrowed by loading (charging) the adapters on the boat 217, there is no need to change the configuration of the boat 217.

<Modification 1>

Figure 20:
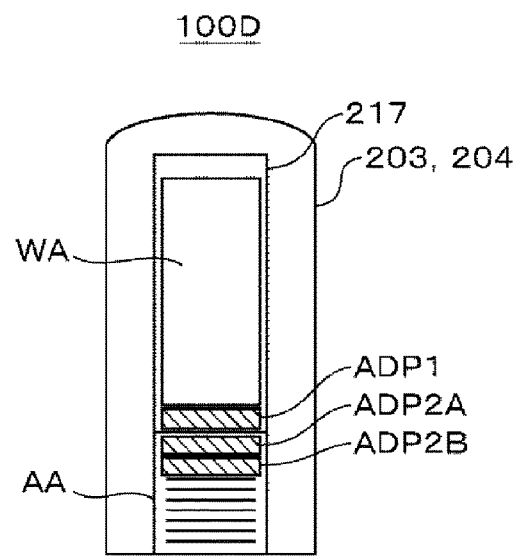
FIG. 20 is a cross sectional view schematically illustrating an internal configuration of a process vessel according to modification 1.

A substrate processing apparatus according to a first modification (modification 1) will be described with reference to FIG. 20.

Similar to the substrate processing apparatus 100, in a substrate processing apparatus 100D according to modification 1, the inner wall surface of the ceiling of the process vessel 204 (reaction tube 203) has a dome shape, and in addition, the space SPL between the wafer arrangement region WA and the heat insulating plate arrangement region AA is blocked by the adapter ADP1 and the upper side of the heat insulating plate arrangement region AA is blocked by the adapters ADP2A and ADP2B. Furthermore, other components of the substrate processing apparatus 100D are similar to those of the substrate processing apparatus 100 according to the aforementioned embodiment. With this configuration, it is possible to reduce the space below the wafer arrangement region WA (the gap between the space SPL and the heat insulating plate 218 on the upper side of the heat insulating plate arrangement region AA).

As described above in example 1, when the accumulated film thickness is about 8,000 Å, there is no difference between the substrate processing apparatus 100A and the substrate processing apparatus 100 and the effect of the reaction tube having the upper flat structure becomes invisible. Furthermore, as described above in example 2, by using the adapter burying the space below the wafer arrangement region WA, the improvement effect can be obtained on the upper side of the boat 217, as well as on the lower side of the boat 217. As described above, it is considered that, as the space below the wafer arrangement region WA is removed, the increase in the flow velocity of the precursor gas on the lower side of the boat 217, elimination of escape of gas to the space below the wafer arrangement region WA, and the increase in the spreading of a gas to the upper side of the boat 217 are major factors. Thus, even in the substrate processing apparatus 100D according to modification 1, the film thickness distribution is improved in a convex direction in the entire zone. Moreover, since the space is narrowed by loading the adapter on the boat 217, there is no need to change the configuration of the process vessel 204 (reaction tube 203) and the boat 217.

<Modification 2>

Figure 21:
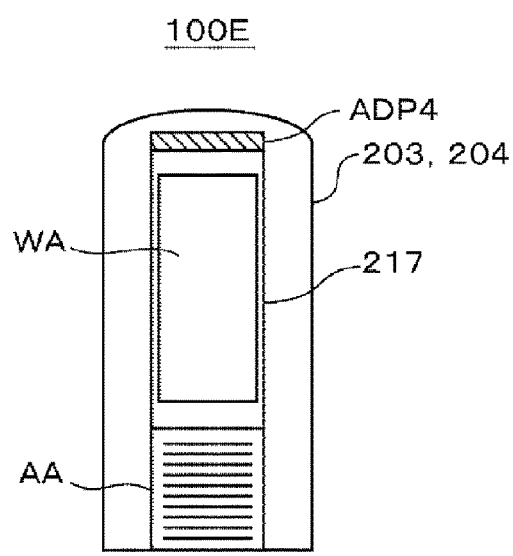
FIG. 21 is a diagram schematically illustrating an internal configuration of a process vessel according to modification 2.

A substrate processing apparatus according to a second modification (modification 2) will be described with reference to FIG. 21.

Similar to the substrate processing apparatus 100, in a substrate processing apparatus 100E according to modification 2, the inner wall surface of the ceiling of the process vessel 204 (reaction tube 203) has a dome shape, and in addition, an adapter ADP4 is loaded on the boat 217. Furthermore, other components of the substrate processing apparatus 100E are similar to those of the substrate processing apparatus 100 according to the aforementioned embodiment. With this configuration, it is possible to reduce the space SPT between the ceiling of the process vessel 204 (reaction tube 203) and the boat 217. Thus, the same effects as those of example 1 may be achieved. In addition, since the space is narrowed by loading the adapter on the boat 217, there is no need to change the configuration of the process vessel 204 (reaction tube 203) and the boat 217.

<Modification 3>

Figure 22:
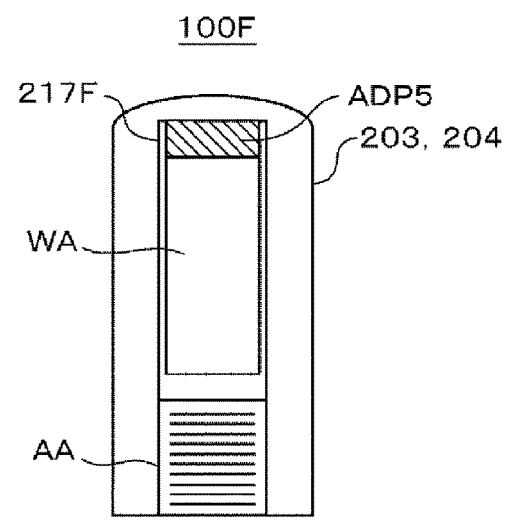
FIG. 22 is a diagram schematically illustrating an internal configuration of a process vessel according to modification 3.

A substrate processing apparatus according to a third modification (modification 3) will be described with reference to FIG. 22.

Similar to the substrate processing apparatus 100, in a substrate processing apparatus 100F according to modification 3, the inner wall surface of the ceiling of the process vessel 204 (reaction tube 203) has a dome shape, and in addition, the entire length of the boat 217 is extended, and the space above the wafer arrangement region WA is blocked by an adapter ADP5. Furthermore, other components of the substrate processing apparatus 100F are similar to those of the substrate processing apparatus 100 according to the aforementioned embodiment. With this configuration, it is possible to reduce the space SPT between the ceiling of the process vessel 204 (reaction tube 203) and the boat 217 and the space SPU above the wafer arrangement region WA. Thus, the same effects as those of example 1 may be achieved.

<Modification 4>

Figure 23:
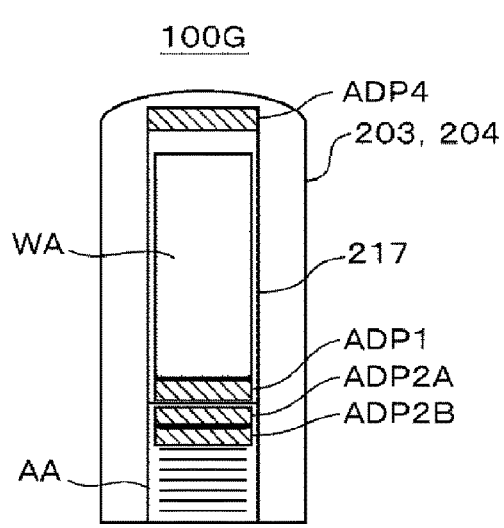
FIG. 23 is a diagram schematically illustrating an internal configuration of a process vessel according to modification 4.

A substrate processing apparatus according to a fourth modification (modification 4) will be described with reference to FIG. 23.

Similar to the substrate processing apparatus 100, in a substrate processing apparatus 100G according to modification 4, the inner wall surface of the ceiling of the process vessel 204 (reaction tube 203) has a dome shape, and in addition, the adapter ADP4 is loaded on the boat 217 and the space SPL between the wafer arrangement region WA and the heat insulating plate arrangement region AA is blocked by the adapter ADP1 and the upper side of the heat insulating plate arrangement region AA is blocked by the adapters ADP2A and ADP2B. Furthermore, other components of the substrate processing apparatus 100G are similar to those of the substrate processing apparatus 100 according to the aforementioned embodiment. With this configuration, it is possible to reduce the space SPT between the ceiling of the process vessel 204 (reaction tube 203) and the boat 217 and to reduce the space below the wafer arrangement region WA (the gap between the space SPL and the heat insulating plate 218 on the upper side of the heat insulating arrangement region AA). Thus, the same effects as those of example 2 may be achieved. In addition, since the space is narrowed by loading the adapter on the boat 217, there is no need to change the configuration of the process vessel 204 (reaction tube 203) and the boat 217.

<Modification 5>

Figure 24:
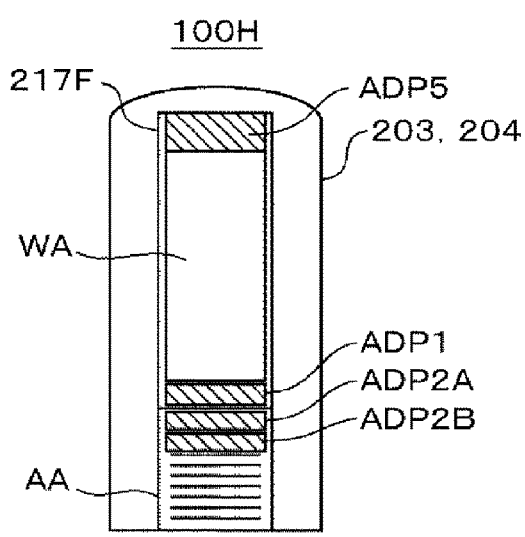
FIG. 24 is a diagram schematically illustrating an internal configuration of a process vessel according to modification 5.

A substrate processing apparatus according to a fifth modification (modification 5) will be described with reference to FIG. 24.

Similar to the substrate processing apparatus 100, in a substrate processing apparatus 100F according to modification 5, the inner wall surface of the ceiling of the process vessel 204 (reaction tube 203) has a dome shape, and in addition, the entire length of the boat 217 is extended and the space above the wafer arrangement region WA is blocked by the adapter ADP5 and the space SPL between the wafer arrangement region WA and the heat insulating plate arrangement region AA is blocked by the adapter ADP1 and the upper side of the heat insulating plate arrangement region AA is blocked by the adapters ADP2A and ADP2B. Furthermore, other components of the substrate processing apparatus 100H are similar to those of the substrate processing apparatus 100 according to the aforementioned embodiment. With this configuration, it is possible to reduce the space SPT between the ceiling of the process vessel 204 (reaction tube 203) and the boat 217 and reduce the space SPU above the wafer arrangement region WA and the space below the wafer arrangement region WA (the gap between the space SPL and the heat insulating plate 218 on the upper side of the heat insulating plate arrangement region AA). Thus, the same effects as those of example 3 may be achieved.

In examples 2 and 3 and in modifications 1 to 5, the adapters blocking the space or the gap are used, but those adapters ADP1, ADP2A, ADP2B, ADP3, ADP4, and ADP5 are configured as plates having a hollow or solid disc shape made of quartz or SiC. By configuring the adapters as plates having a hollow disc shape, the adapters can be reduced in weight. Since the adapters have a plate shape, they may also be referred to as plate-shaped adapters. A thickness (plate thickness) of each of the adapters is configured to be greater than that of the heat insulating plate 218. More preferably, the thickness of each of the adapters is configured to be greater than that of the water 200.

Furthermore, preferably, the diameter of each of the adapters is equal to or greater than that of the wafer 200 and equal to or greater than that of the heat insulating plate 218. More preferably, the diameter of each of the adapters is greater than that of the wafer 200 and greater than that of the heat insulating plate 218. This makes it possible to further suppress escape of a gas to the space.

According to the configurations of examples 2 and 3 and modifications 1 to 5, when the process gas is supplied by the short pulse, for example, when the HCDS gas and the pyridine gas and the $H_2O$ gas and the pyridine gas are supplied by the short pulse, the purge efficiency within the process vessel performed between supply pulses of the process gas can be enhanced and the introduction of $H_2O$ to the deposits adhered to the inner wall or the like of the process vessel (reaction tube) can be suppressed. That is, even when the accumulated film thickness is increased, it becomes possible to suppress an influence of desorption of $H_2O$ from the deposit. In a case where the process gas flows to a plurality of wafers from the side of the wafer arrangement region as in the aforementioned embodiment, the respective examples, or the respective modifications, these effects may also be enhanced. Furthermore, these effects may also be increased by supplying the inert gas to the wafers from the side of the wafer arrangement region within the process vessel when the process gas is exhausted, by vacuumizing the interior of the process vessel, or by alternately performing the supply of the inert gas to the wafers and the vaccumization on the interior of the process vessel a predetermined number of times.

The lower region space may be finely adjusted by configuring the adapter as one or a plurality of plate-shaped adapters and by setting the number of the plate-shaped adapters blocking the region space below the wafer arrangement region to be greater than the number of the plate-shaped adapters blocking the region space above the wafer arrangement region.

According to the substrate processing apparatuses of the respective examples and modifications, it is possible to change the tendency of the in-plane film thickness distribution to a convex direction in the upper portion and lower portion of the process chamber, and it is possible to control the direction between the wafers (inter-plane direction) in the in-plane film thickness distribution, namely inter-plane film thickness distribution, by aligning the central portion of the process chamber and the tendency.

In a photolithography process of an advanced semiconductor device, a fine pattern is formed using a double patterning (DP) technology, from the viewpoint of the limitation of pattern formation performance by an exposure device alone. In the DP technology, an oxide film formed on a side surface of a primary pattern is used as a secondary pattern mask material, but it is necessary to form the oxide film or the like at 100 degrees C. or lower, due to restrictions of a heat resistant temperature of the underlying primary pattern film.

For example, an ultra low temperature oxide (ULTO) film forming technology is a technology of forming an oxide film at 100 degrees C. or lower and has attracted attention as a mask material forming technology of the DP technology. Recently, the ULTO film is required to have enhanced novel performance due to an increase in the number of processes of photolithography or a high level of requirements. In particular, the number of processes is remarkably increased and it is the most urgent matter to expand a film thickness uniformity control region of an oxide film and to increase the productivity.

Recently, in order to cope with next-generation devices in the ULTO, it is required to have strict uniformity in in-plane and inter-plane directions.

Thus, the oxide films formed by the substrate processing apparatuses according to the respective examples and the respective modifications may satisfy the film thickness uniformity required for the ULTO, and when the oxide film is used as a mask material of the DP technology, since the variations in pattern widths of wafers to be processed in the upper portion and lower portion of the process chamber are reduced, defective devices can be reduced.

Furthermore, the embodiment, the respective examples and the respective modifications described above may be appropriately combined with one another.

Although the present disclosure made by inventors has been concretely described based on the embodiments, examples, and modifications, the present disclosure is not limited to the above-described embodiments, examples, and modifications. A variety of modifications may be possible.
<Aspects of the Present Disclosure>

Hereinafter, some aspects of the present disclosure will be additionally stated as supplementary notes.
(Supplementary Note 1)

According to one aspect of the present disclosure, there is provided a method of manufacturing a semiconductor device or a substrate processing method, including:

arranging and accommodating a plurality of substrates in a vertical direction in a process vessel and blocking, by an adaptor, at least one of an upper space and a lower space of a substrate arrangement region, in which the plurality of substrates is arranged; and forming a film on each of the plurality of substrates by performing a cycle a predetermined number of times whiling blocking the at least one of the upper space and the lower space of the substrate arrangement region, the cycle including non-simultaneously performing:

supplying a precursor gas to the plurality of substrates from a side of the substrate arrangement region in the process vessel;

exhausting the precursor gas from the process vessel through an exhaust pipe;

supplying a reaction gas to the plurality of substrates from the side of the substrate arrangement region in the process vessel; and exhausting the reaction gas from the process vessel through the exhaust pipe.

(Supplementary Note 2)

In the method of Supplementary Note 1, in the act of supplying the precursor gas, the supply of the precursor gas may be stopped while adsorption of the precursor gas onto the plurality of substrates is unsaturated. That is to say, the supply of the precursor gas may be stopped before the adsorption of the precursor onto the substrates is saturated.

(Supplementary Note 3)

In the method of Supplementary Note 1 or 2, in the act of supplying the precursor gas, the supply of the precursor gas may be stopped while an adsorption layer of the precursor gas formed on the plurality of substrates is a discontinuous layer. That is to say, the supply of the precursor gas may be stopped before the adsorption layer of the precursor gas formed on the plurality of substrates becomes a continuous layer.

(Supplementary Note 4)

In the method of any one of Supplementary Notes 1 to 3, an exhaust valve may be installed in the exhaust pipe, and in the act of supplying the precursor gas, an opening degree of the exhaust valve may be set to become fully closed. That is to say, the exhaust pipe is closed and the exhaust of the precursor gas from the exhaust pipe is stopped.

(Supplementary Note 5)

In the method of Supplementary Note 4, in the act of supplying the reaction gas, the opening degree of the exhaust valve may be set to become fully closed. That is to say, the exhaust pipe is closed and the exhaust of the reaction gas from the exhaust pipe is stopped.

(Supplementary Note 6)

In the method of Supplementary Note 5, in the act of exhausting the precursor gas and in the act of exhausting the reaction gas, the opening degree of the exhaust valve may be set to become fully opened.

(Supplementary Note 7)

In the method of any one of Supplementary Notes 1 to 6, in the act of supplying the precursor gas, a catalyst gas may be supplied together with the precursor gas.

(Supplementary Note 8)

In the method of any one of Supplementary Notes 1 to 7, in the act of supplying the reaction gas, a catalyst gas may be supplied together with the reaction gas.

(Supplementary Note 9)

In the method of any one of Supplementary Notes 1 to 8, a catalyst gas may be supplied together with the precursor gas in the act of supplying the precursor gas, and a catalyst gas may be supplied together with the reaction gas in the act of supplying the reaction gas.

(Supplementary Note 10)

In the method of any one of Supplementary Notes 1 to 9, an inner wall surface of ceiling of the process vessel may be horizontal and flat.

(Supplementary Note 11)

In the method of any one of Supplementary Notes 1 to 10, the adaptor may be configured as one or more plate-shaped adaptors, and a number of at least one plate-shaped adaptor among the one or more plate-shaped adaptors configured to block the lower space of the substrate arrangement region may be set larger than a number of at least one plate-shaped adaptor among the one or more plate-shaped adaptors configured to block the upper space of the substrate arrangement region.

(Supplementary Note 12)

In the method of any one of Supplementary Notes 1 to 11, a plurality of heat insulating plates may be arranged in a vertical direction below the substrate arrangement region in the process vessel, and the adapter configured to block the lower space of the substrate arrangement region may be installed to block a space between the substrate arrangement region and a heat insulating plate arrangement region in which the plurality of heat insulating plates are arranged.

(Supplementary Note 13)

In the method of Supplementary Note 12, the adaptor may have a thickness greater than that of each of the plurality of heat insulating plates. Specifically, a thickness of the adaptor may be greater than that of each of the plurality of substrates. Furthermore, a diameter of the adaptor may be equal to or greater than that of each of the plurality of substrates and equal to or greater than that of each of the plurality of heat insulating plates. More specifically, the diameter of the adaptor may be greater than that of each of the plurality of substrates and greater than that of each of the plurality of heat insulating plates.

(Supplementary Note 14)

In the method of any one of Supplementary Notes 1 to 13, the act of exhausting the precursor gas and the act of exhausting the reaction gas may include supplying an inert gas to the plurality of substrates from the side of the substrate arrangement region in the process vessel.

(Supplementary Note 15)

In the method of Supplementary Note 14, the act of exhausting the precursor gas and the act of exhausting the reaction gas may include vacuumizing the interior of the process vessel.

(Supplementary Note 16)

In the method of Supplementary Note 15, in the act of exhausting the precursor gas and in the act of exhausting the reaction gas, the act of supplying the inert gas to the plurality of substrates and the act of vacuumizing the interior of the process vessel may be alternately performed a predetermined number of times.

(Supplementary Note 17)

In the method of any one of Supplementary Notes 1 to 16, the precursor gas may include a predetermined element (a semiconductor element or a metal element) and a chloro group or an amino group, and the reaction gas may include an oxidizing gas.

(Supplementary Note 18)

In the method of Supplementary Note 17, the oxidizing gas may include an $H_2O$ gas. In this case, specifically, the catalyst gas may be supplied together with the precursor gas in the act of supplying the precursor gas and the catalyst gas may be supplied together with the $H_2O$ gas as the reaction gas (the oxidizing gas) in the act of supplying the reaction gas.

(Supplementary Note 19)

According to another aspect of the present disclosure, there is provided a substrate processing apparatus, including:

a process vessel configured to accommodate a plurality of substrates;

a gas supply system configured to supply a gas into the process vessel;

an exhaust system configured to exhaust a gas in the process vessel through an exhaust pipe;

a support configured to arrange and support the plurality of substrates in a vertical direction, and support an adaptor located in at least one of an upper space and a lower space of a substrate arrangement region in which the plurality of substrates is arranged;

a transfer part configured to transfer the support into the process vessel; and a control part configured to control the gas supply system, the exhaust system, and the transfer part to perform:

arranging and accommodating the plurality of substrates in the vertical direction in the process vessel by transferring the support that supports the plurality of substrates and the adaptor into the process vessel, and blocking the at least one of the upper space and the lower space of the substrate arrangement region by the adaptor; and forming a film on each of the plurality of substrates by performing a cycle a predetermined number of times while blocking the at least one of the upper space and the lower space of the substrate arrangement region, the cycle including non-simultaneously performing:

supplying a precursor gas to the plurality of substrates from a side of the substrate arrangement region in the process vessel;

exhausting the precursor gas from the process vessel through the exhaust pipe;

supplying a reaction gas to the plurality of substrates from the side of the substrate arrangement region in the process vessel; and exhausting the reaction gas from the process vessel through the exhaust pipe.

(Supplementary Note 20)

According to a further aspect of the present disclosure, there is provided a program or a non-transitory computer-readable recording medium storing the program that causes a computer to perform a process including:

arranging and accommodating a plurality of substrates in a vertical direction in a process vessel and blocking, by an adaptor, at least one of an upper space and a lower space of a substrate arrangement region in which the plurality of substrates is arranged; and forming a film on each of the a plurality of substrates by performing a cycle a predetermined number of times whiling blocking the at least one of the upper space and the lower space of the substrate arrangement region, the cycle including non-simultaneously performing:

supplying a precursor gas to the plurality of substrates from a side of the substrate arrangement region in the process vessel;

exhausting the precursor gas from the process vessel through an exhaust pipe;

supplying a reaction gas to the plurality of substrates from the side of the substrate arrangement region in the process vessel; and exhausting the reaction gas from the process vessel through the exhaust pipe.

EXPLANATION OF REFERENCE NUMERALS

200: wafer (substrate), 203 and 203F: reaction tube, 204 and 204F: process vessel, 217: boat, 218: heat insulating plate, AA: heat insulating arrangement region, ADP1 and ADP2: adaptor, WA: wafer arrangement region (substrate arrangement region)

What is claimed is:

1. A method of manufacturing a semiconductor device, comprising:

(a) arranging and accommodating a plurality of substrates in a vertical direction in a process vessel and blocking, by an adaptor, a lower space of a substrate arrangement region in which the plurality of substrates is arranged, wherein the adaptor configured to block the lower space of the substrate arrangement region is installed to block a space between the substrate arrangement region and a heat insulating plate arrangement region, in which a plurality of heat insulating plates are arranged, and a space between the heat insulating plates in an upper space of the heat insulating plate arrangement region; and (b) forming a film on each of the plurality of substrates by performing a cycle a predetermined number of times whiling blocking the lower space of the substrate arrangement region, the cycle including non-simultaneously performing:

(b1) supplying a precursor gas to the plurality of substrates from a side of the substrate arrangement region in the process vessel;

(b2) exhausting the precursor gas from the process vessel through an exhaust pipe;

(b3) supplying a reaction gas to the plurality of substrates from the side of the substrate arrangement region in the process vessel; and (b4) exhausting the reaction gas from the process vessel through the exhaust pipe.

2. The method of claim 1, wherein in the act of (b1), the supply of the precursor gas is stopped while adsorption of the precursor gas onto the plurality of substrates is unsaturated.

3. The method of claim 1, wherein in the act of (b1), the supply of the precursor gas is stopped while an adsorption layer of the precursor gas formed on the plurality of substrates is a discontinuous layer.

4. The method of claim 1, wherein an exhaust valve is installed in the exhaust pipe, and in the act of (b1), an opening degree of the exhaust valve is set to become fully closed.

5. The method of claim 4, wherein in the act of (b3), the opening degree of the exhaust valve is set to become fully closed.

6. The method of claim 5, wherein in the acts of (b2) and (b4), the opening degree of the exhaust valve is set to become fully opened.

7. The method of claim 1, wherein in the act of (b1), a catalyst gas is supplied together with the precursor gas.

8. The method of claim 1, wherein in the act of (b3), a catalyst gas is supplied together with the reaction gas.

9. The method of claim 1, wherein a catalyst gas is supplied together with the precursor gas in the act of (b1), and a catalyst gas is supplied together with the reaction gas in the act of (b3).

10. The method of claim 1, wherein an inner wall surface of ceiling of the process vessel is horizontal and flat.

11. The method of claim 1, wherein the adaptor is configured as one or more plate-shaped adaptors, and a number of at least one plate-shaped adaptors among the one or more plate-shaped adaptors configured to block the lower space of the substrate arrangement region is set larger than a number of at least one plate-shaped adaptors configured to block an upper space of the substrate arrangement region.

12. The method of claim 1, wherein the plurality of heat insulating plates are arranged in a vertical direction below the substrate arrangement region in the process vessel.

13. The method of claim 12, wherein a thickness of the adaptor is greater than a thickness of each of the plurality of heat insulating plates.

14. A substrate processing apparatus, comprising:
- a process vessel configured to accommodate a plurality of substrates;
- a gas supply system configured to supply a gas into the process vessel;
- a support configured to arrange and support the plurality of substrates in a vertical direction, and support an adaptor located in a lower space of a substrate arrangement region in which the plurality of substrates is arranged, the adaptor being configured to block the lower space of the substrate arrangement region and being installed to block a space between the substrate arrangement region and a heat insulating plate arrangement region, in which a plurality of heat insulating plates are arranged, and a space between the heat insulating plates in an upper space of the heat insulating plate arrangement region;
- a transfer part configured to transfer the support into the process vessel; and
- a control part configured to control the gas supply system, an exhaust system, and the transfer part to perform:
  - (a) arranging and accommodating the plurality of substrates in the vertical direction in the process vessel by transferring the support that supports the plurality of substrates and the adaptor into the process vessel, and blocking the lower space of the substrate arrangement region by the adaptor; and
  - (b) forming a film on each of the plurality of substrates by performing a cycle a predetermined number of times while blocking the lower space of the substrate arrangement region, the cycle including non-simultaneously performing:
    - (b1) supplying a precursor gas to the plurality of substrates from a side of the substrate arrangement region in the process vessel;
    - (b2) exhausting the precursor gas from the process vessel through an exhaust pipe;
    - (b3) supplying a reaction gas to the plurality of substrates from the side of the substrate arrangement region in the process vessel; and
    - (b4) exhausting the reaction gas from the process vessel through the exhaust pipe.

15. A computer-readable recording medium storing a program that causes a computer to perform a process, the process comprising:
- (a) arranging and accommodating a plurality of substrates in a vertical direction in a process vessel and blocking, by an adaptor, a lower space of a substrate arrangement region in which the plurality of substrates is arranged, wherein the adaptor configured to block the lower space of the substrate arrangement region is installed to block a space between the substrate arrangement region and a heat insulating plate arrangement region, in which a plurality of heat insulating plates are arranged, and a space between the heat insulating plates in an upper space of the heat insulating plate arrangement region; and
- (b) forming a film on each of the plurality of substrates by performing a cycle a predetermined number of times whiling blocking the lower space of the substrate arrangement region, the cycle including non-simultaneously performing:
  - (b1) supplying a precursor gas to the plurality of substrates from a side of the substrate arrangement region in the process vessel;
  - (b2) exhausting the precursor gas from the process vessel through an exhaust pipe;
  - (b3) supplying a reaction gas to the plurality of substrates from the side of the substrate arrangement region in the process vessel; and
  - (b4) exhausting the reaction gas from the process vessel through the exhaust pipe.

* * * * *